United States Patent
Nosaka et al.

(10) Patent No.: US 12,255,640 B2
(45) Date of Patent: Mar. 18, 2025

(54) DRIVING CIRCUIT FOR SWITCHING ELEMENT AND SWITCHING CIRCUIT

(71) Applicant: OMRON Corporation, Kyoto (JP)

(72) Inventors: Noriyuki Nosaka, Kyoto (JP); Hironori Tauchi, Kyoto (JP); Takuro Hashimoto, Kyoto (JP); Wataru Okada, Kyoto (JP); Mamoru Sueki, Kyoto (JP); Satoshi Iwai, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 18/245,930

(22) PCT Filed: Sep. 7, 2021

(86) PCT No.: PCT/JP2021/032872
§ 371 (c)(1),
(2) Date: Mar. 20, 2023

(87) PCT Pub. No.: WO2022/070806
PCT Pub. Date: Apr. 7, 2022

(65) Prior Publication Data
US 2023/0387912 A1     Nov. 30, 2023

(30) Foreign Application Priority Data

Oct. 1, 2020    (JP) .................... 2020-166953

(51) Int. Cl.
*H03K 17/687*     (2006.01)
*H03K 17/0412*    (2006.01)
*H03K 17/16*      (2006.01)

(52) U.S. Cl.
CPC ... *H03K 17/6871* (2013.01); *H03K 17/04123* (2013.01); *H03K 17/168* (2013.01)

(58) Field of Classification Search
CPC ......... H03K 17/6871; H03K 17/04123; H03K 17/168; H03K 2017/066; H03K 17/063;
(Continued)

(56) References Cited

U.S. PATENT DOCUMENTS

| 6,661,276 B1 | 12/2003 | Chang |
| 2015/0146468 A1* | 5/2015 | Cho .................. H02M 7/5387 327/109 |

(Continued)

FOREIGN PATENT DOCUMENTS

| JP | 2013085409 A | 5/2013 |
| JP | 2013099133 A | 5/2013 |

(Continued)

OTHER PUBLICATIONS

International Search Report issued in Intl. Appln. No. PCT/JP2021/032872 mailed Nov. 9, 2021. English translation provided.

(Continued)

*Primary Examiner* — Metasebia T Retebo
(74) *Attorney, Agent, or Firm* — ROSSI, KIMMS & McDOWELL LLP

(57) ABSTRACT

A driving circuit that drives a switching element, the driving circuit includes: a controller that includes a first terminal connected to a gate terminal of the switching element and a second terminal connected to a source terminal of the switching element, and outputs a control signal from the first terminal to the gate terminal; a first capacitor and a first resistor connected in parallel; and a second capacitor and a second resistor connected in parallel, in which the first capacitor and the first resistor are connected in series to a first connecting wire for connecting the gate terminal and the first terminal on the gate terminal side of the first connecting wire, and in which the second capacitor and the second (Continued)

resistor are connected in series to the first connecting wire on the first terminal side of the first connecting wire.

11 Claims, 31 Drawing Sheets

(58) Field of Classification Search
CPC ........ H03K 17/162; H03K 2217/0036; H02M 1/08
See application file for complete search history.

(56) References Cited

U.S. PATENT DOCUMENTS

| | | | |
|---|---|---|---|
| 2016/0261266 A1* | 9/2016 | Kampl | ................. H03K 17/165 |
| 2019/0036519 A1* | 1/2019 | Hu | ..................... H03K 17/0412 |
| 2021/0367499 A1 | 11/2021 | Nosaka et al. | |

FOREIGN PATENT DOCUMENTS

| | | | | |
|---|---|---|---|---|
| JP | 2014093586 A | 5/2014 | | |
| JP | 2015073147 A | 4/2015 | | |
| WO | WO-2019159655 A1 * | 8/2019 | ............. | H02M 1/08 |
| WO | 2020084806 A1 | 4/2020 | | |
| WO | WO-2020084807 A1 * | 4/2020 | ............. | H02M 1/08 |

OTHER PUBLICATIONS

Written Opinion issued in Intl. Appln. No. PCT/JP2021/032872 mailed Nov. 9, 2021. English translation provided.

* cited by examiner

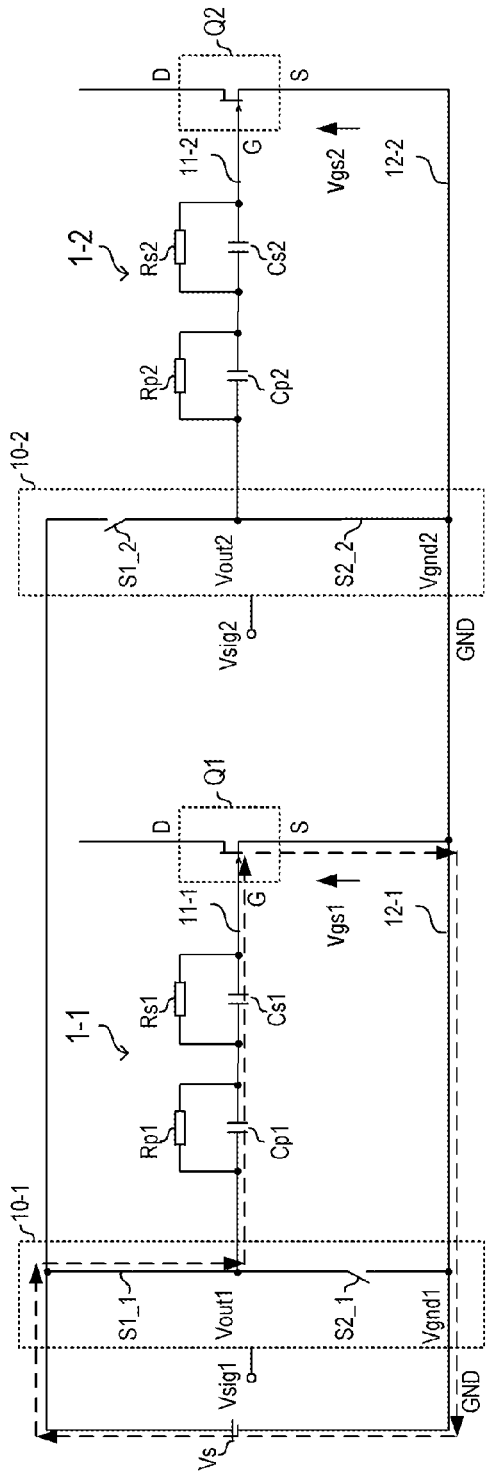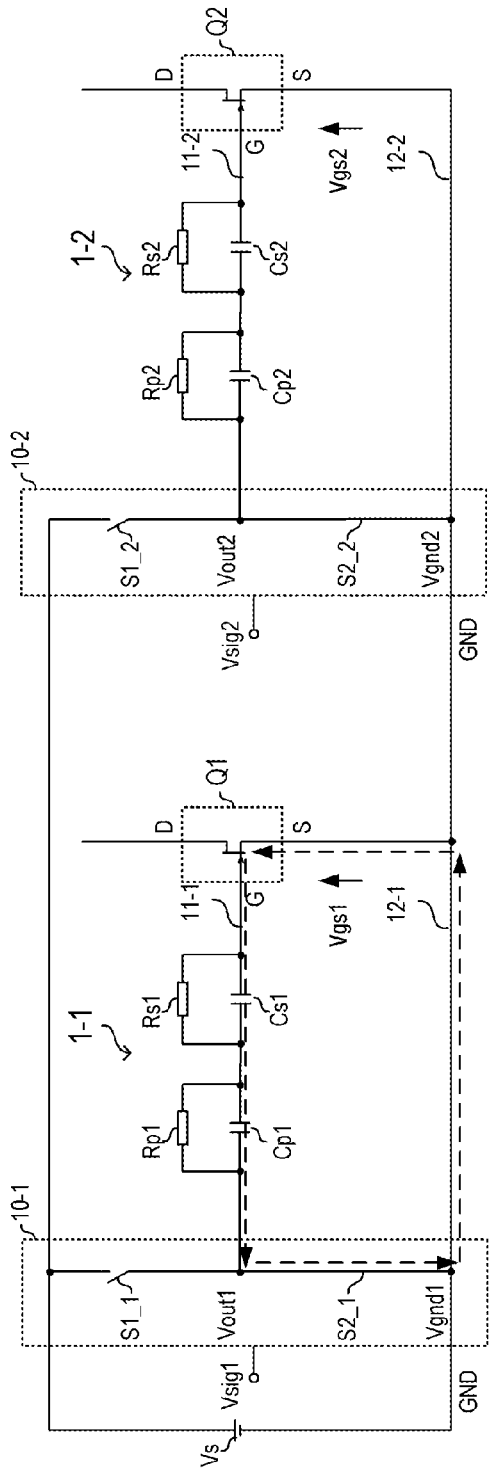
Fig. 10A
Fig. 10B

DRIVING CIRCUIT FOR SWITCHING ELEMENT AND SWITCHING CIRCUIT

TECHNICAL FIELD

The present invention relates to a driving circuit for a switching element and a switching circuit including the same.

BACKGROUND ART

Conventionally, a technique using a JFET or the like made of SiC (silicon carbide) as a switching element in a power converter or the like has been proposed. In such a driving circuit for a switching element, a capacitor having a capacitance larger than the stray capacitance generated between the drain and the gate is provided between the gate and the source of the switching element in order to prevent malfunction. Furthermore, in order to prevent a malfunction, a technique for realizing negative biasing by using a speed-up capacitor CgD has been proposed (see, for example, Patent Document 1). Similarly, a technique for realizing negative biasing using a Zener diode has also been proposed (see, for example, Patent Document 2).

Here, when negative biasing is used in the driving circuit for the conventional switching element as described above, there may be a disadvantage that a reverse conduction loss due to an internal diode of the switching element increases in proportion to a negative bias voltage. In addition, since the reverse conduction loss is also proportional to the frequency, an increase in the reverse conduction loss becomes a problem even when switching is performed at a high frequency.

In a case where arms including the switching elements described in Patent Document 1 described above are connected in series to form a half bridge, a reverse conduction loss as described above increases in a dead time period in which both the switching elements are turned off, and further problems occur. That is, by providing a RC circuit including a speed-up capacitor CgD in the gate, a gate surge increases when the gate is turned off. When a voltage equal to or higher than the rated voltage Vrat is applied as the gate voltage due to such a gate surge, the switching element may be broken. In addition, when one switching element is turned off, the gate voltage attenuates to 0 V due to an RC time constant. Therefore, when switching noise due to switching of the other switching element occurs, the gate voltage becomes high, and there is a possibility of erroneous ignition. Here, if the negative bias is increased so as not to cause erroneous ignition, the gate voltage exceeds the rated voltage Vrat.

PRIOR ART DOCUMENTS

Patent Documents

Patent Document 1: Japanese Unexamined Patent Publication No. 2013-99133
Patent Document 2: Japanese Unexamined Patent Publication No. 2014-93586

SUMMARY OF THE INVENTION

Problems to be Solved by the Invention

The present invention has been made in view of the above problems, and an object of the present invention is to provide a technique capable of reducing loss due to a negative bias voltage, suppressing breakdown of a switching element due to a surge voltage, and suppressing erroneous ignition of the switching element due to switching noise in a driving circuit for the switching element.

Means for Solving the Problem

The present invention for solving the above problems is a driving circuit that drives a switching element, the driving circuit including:
  a controller that includes a first terminal connected to a gate terminal of the switching element via a first connecting wire and a second terminal connected to a source terminal of the switching element via a second connecting wire, and outputs a control signal from the first terminal to the gate terminal;
  a first capacitor and a first resistor connected in parallel; and
  a second capacitor and a second resistor connected in parallel,
  in which the first capacitor and the first resistor are connected in series to the first connecting wire on the gate terminal side of the first connecting wire, and
  in which the second capacitor and the second resistor are connected in series to the first connecting wire on the first terminal side of the first connecting wire.

According to the present invention, the switching element transitions to the turn-off state by discharging the charge accumulated in the input capacitance of the switching element through the first capacitor and the second capacitor connected in series to the first connecting wire, and at this time, the gate-source voltage of the switching element can be turned off at a high voltage, so that the surge voltage between the gate and the source can be reduced, the breakdown of the switching element can be suppressed, and the reverse conduction loss due to the negative bias can be suppressed. In addition, since the input capacitance of the switching element, the first capacitor, and the second capacitor are charged and discharged through the first resistor connected in parallel to the first capacitor and the second resistor connected in parallel to the second capacitor, it is possible to prevent erroneous ignition of the switching element by keeping a gate-source voltage low when switching noise occurs. The gate-source voltage of the switching element is held at a high voltage. As a result, the reverse conduction loss due to the negative bias can be reduced.

Further, in the present invention,
  a mirror clamp circuit may be provided between a midpoint between the first capacitor and the first resistor and the second capacitor and the second resistor in the first connecting wire and the second connecting wire.

According to this, since the impedance of the mirror current can be reduced by the mirror clamp circuit, the switching noise generated in the gate-source voltage of the switching element can be reduced.

Further, in the present invention,
  a first diode and a third resistor connected in series may be connected in parallel to the second capacitor and the second resistor, and
  a cathode terminal of the first diode may be connected to the first terminal.

According to this, since the decrease in the gate-source voltage when the switching element is turned off can be adjusted by the first diode and the third resistor, the gate-source voltage can be held at a high value, and the reverse conduction loss can be reduced.

Further, in the present invention,
  a second diode and a fourth resistor connected in series may be connected between the first capacitor and the first resistor and the gate terminal in the first connecting wire and the second connecting wire; and
  a cathode terminal of the second diode may be connected to the first connecting wire.

According to this, by providing the second diode and the fourth resistor, the increase in the gate-source voltage during the period in which the negative bias changes toward 0 V can be adjusted, so that the reverse conduction loss of the switching element during this period can be reduced.

Further, in the present invention,
  a fifth resistor may be connected in series to the first terminal side of the second capacitor,
  the second capacitor and the fifth resistor may be connected in parallel to the second resistor,
  a third diode and a sixth resistor connected in series may be connected in parallel to the fifth resistor, and
  a cathode terminal of the third diode may be connected to the first terminal.

Accordingly, by providing the fifth resistor, the sixth resistor, and the third diode, the switching speed of the switching element can be adjusted.

Further, in the present invention,
  a clamp circuit that holds a voltage of the gate terminal with respect to the source terminal of the switching element at a predetermined voltage value or less may be provided.

According to this, even when a voltage larger than the predetermined voltage value is applied between the gate terminal and the source terminal of the switching element, the voltage is held at the predetermined voltage value or less by the clamp circuit, so that an excessive gate surge can be suppressed.

Further, in the present invention,
  a fourth diode may be connected between a midpoint of the first capacitor and the first resistor and the second capacitor and the second resistor in the first connecting wire and the second connecting wire, and
  a cathode terminal of the fourth diode may be connected to the first connecting wire.

According to this, since the impedance is reduced by the fourth diode connected such that the direction in which the current flows from the second connecting wire to the first connecting wire is the forward direction, even when switching noise occurs in the switching element, the noise can be bypassed, and the switching noise can be reduced.

Further, the present invention can be configured as a switching circuit including the switching element driven by the driving circuit for the switching element.

In addition, by configuring the switching circuit including the switching element driven by the driving circuit for the switching element according to the present invention, the surge voltage of the gate-source voltage of the switching element can be reduced, the breakdown of the switching element can be suppressed, and the reverse conduction loss due to the negative bias can be suppressed. In addition, it is possible to prevent erroneous ignition of the switching element when switching noise occurs due to another switching element.

Further, in the present invention,
  a half bridge circuit configured by the switching element may be included.

According to this, in the switching circuit including the half bridge circuit, the surge voltage of the gate-source voltage of the switching element can be reduced, the breakdown of the switching element can be suppressed, and the reverse conduction loss due to the negative bias can be suppressed. In addition, it is possible to prevent erroneous ignition of the switching element when switching noise occurs due to another switching element.

Further, in the present invention,
  a full bridge circuit configured by the switching element may be included.

According to this, in the switching circuit including the full bridge circuit, the surge voltage of the gate-source voltage of the switching element can be reduced, the breakdown of the switching element can be suppressed, and the reverse conduction loss due to the negative bias can be suppressed. In addition, it is possible to prevent erroneous ignition of the switching element when switching noise occurs due to another switching element.

Effect of the Invention

According to the present invention, it is possible to provide the technique capable of reducing loss due to the negative bias voltage, suppressing breakdown of the switching element due to the surge voltage, and suppressing erroneous ignition of the switching element due to switching noise in the driving circuit for the switching element.

BRIEF DESCRIPTION OF THE DRAWINGS

FIGS. 10A and 10B are diagrams for explaining a current path in the full bridge circuit according to the first embodiment of the present invention.

MODE FOR CARRYING OUT THE INVENTION

Application Example

Hereinafter, application examples of the present invention will be described with reference to the drawings.

Figure 2:
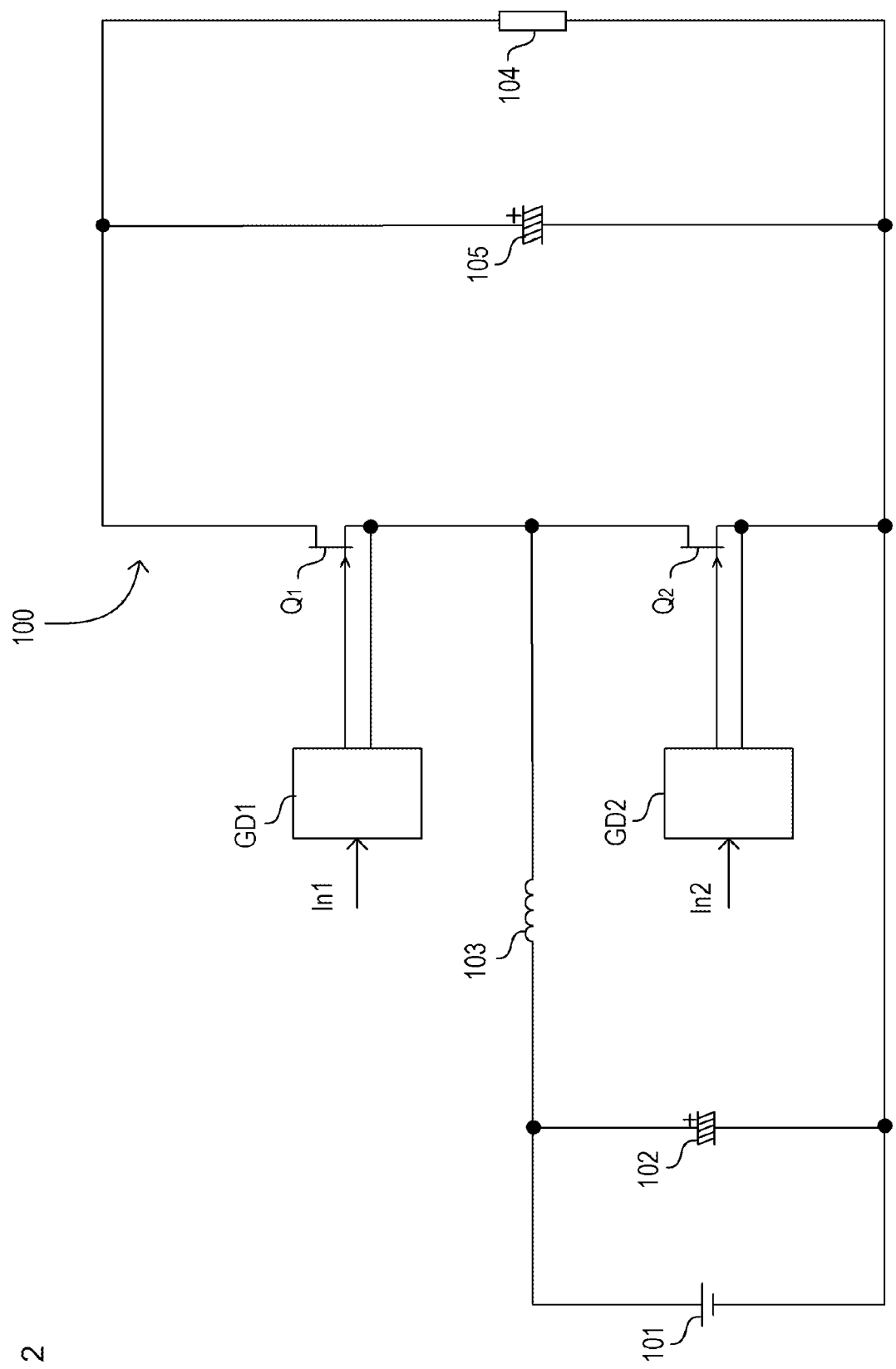
FIG. 2 is a circuit diagram showing a configuration of a synchronous rectification-type boost chopper circuit according to the embodiment of the present invention.

A gate driving circuit according to the present invention can be applied to, for example, a gate driving circuit GD1 and a gate driving circuit GD2 that drive a switching element Q1 and a switching element Q2 of a synchronous rectification-type boost chopper circuit 100 which is a half bridge circuit as shown in FIG. 2.

Figure 30:
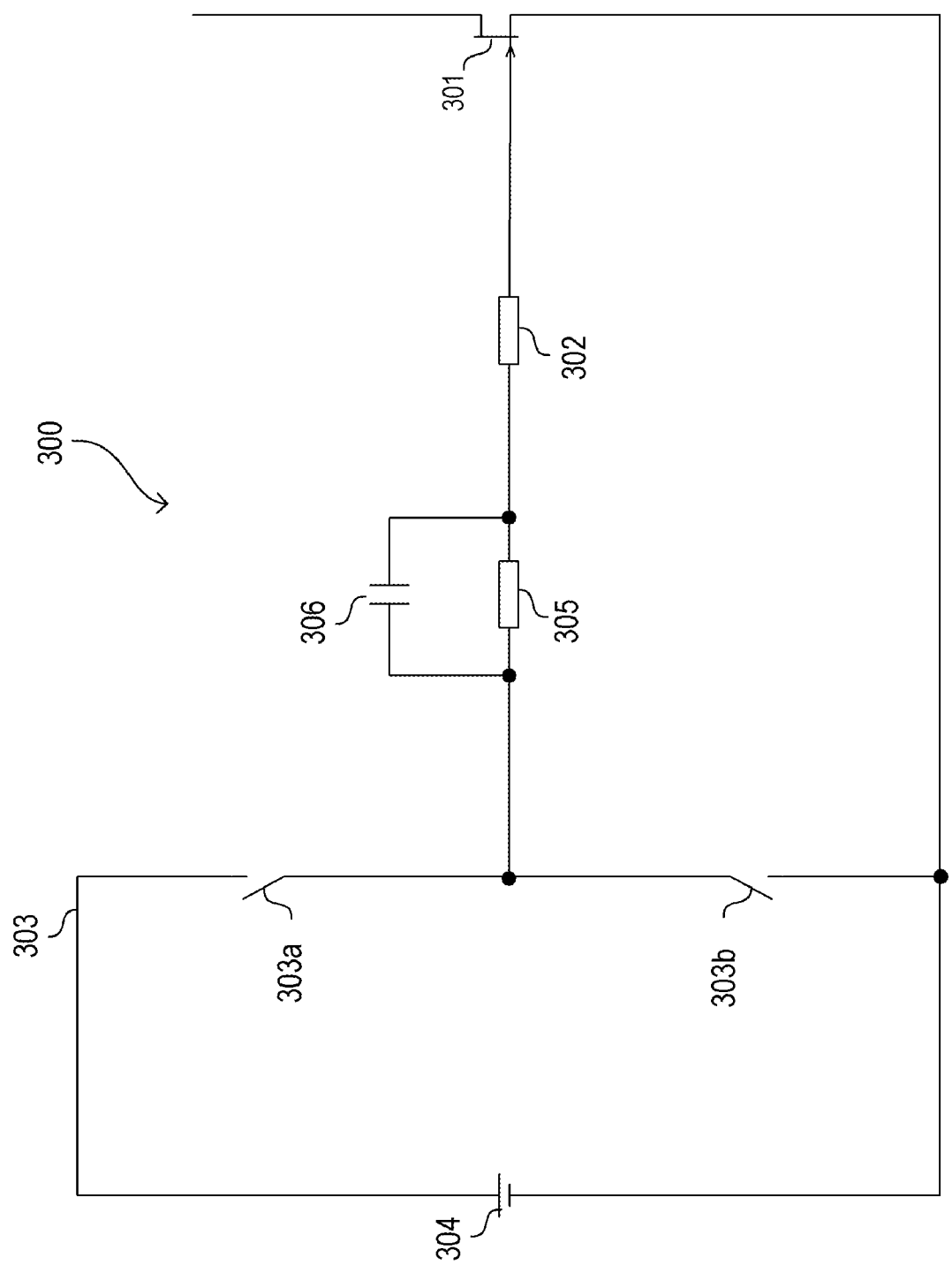
FIG. 30 is a circuit diagram showing a configuration of a conventional gate driving circuit.

First, a conventional gate driving circuit 300 that can be similarly applied to the gate driving circuit GD1 and the gate driving circuit GD2 of the synchronous rectification-type boost chopper circuit 100 will be described with reference to FIG. 30.

In the gate driving circuit 300, a gate resistor 302 is provided on a gate side of a junction field effect transistor (JFET) 301, and is connected to a gate power supply 304 via a switch 303. A second gate resistor 305 is connected in series between the gate resistor 302 and the switch 303, and a capacitor 306 is connected in parallel with the second gate resistor 305.

In the gate driving circuit 300, a switch 303b is turned off and a switch 303a is turned on at the time of turn-on. Therefore, a gate current is injected into the JFET 301 from the gate power supply 304 through the parallel circuit of the second gate resistor 305 and the capacitor 306 and the gate resistor 302. Then, at the time of turn-off, the switch 303a is turned off, and the switch 303b is turned on. Therefore, the gate and the source of the JFET 301 are short-circuited through the gate resistor 302 and the parallel circuit of the second gate resistor 305 and the capacitor 306.

Figure 31:
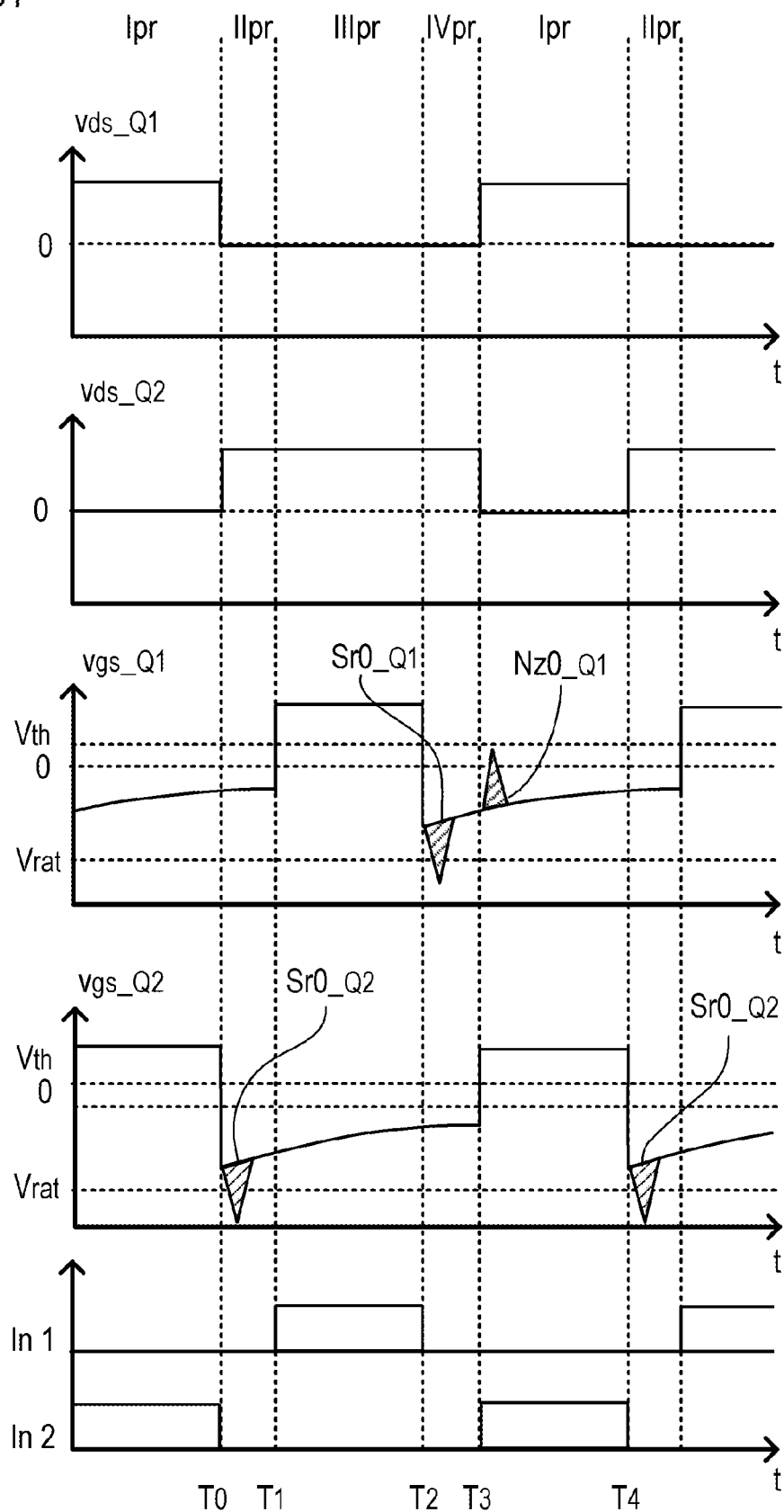
FIG. 31 is an operation sequence diagram of the conventional gate driving circuit.

FIG. 31 shows an operation sequence in a case where such a gate driving circuit 300 is used as the gate driving circuit GD1 and the gate driving circuit GD2 of the synchronous rectification-type boost chopper circuit 100. Here, vds_Q1 and vgs_Q1 represent the drain-source voltage and the gate-source voltage of the switching element Q1, respectively. vds_Q2 and vgs_Q2 represent the drain-source voltage and the gate-source voltage of the switching element Q2, respectively. In1 and In2 represent input signals of the gate driving circuit GD1 and the gate driving circuit GD2, respectively.

When such a gate driving circuit 300 is used, the gate surge Sr0_Q1 at turn-off increases as can be seen in the mode IVpr for vgs_Q1 in FIG. 31. Similarly, as can be seen in the mode IIpr for vgs_Q2, the gate surge Sr0_Q2 at turn-off increases. When a voltage equal to or higher than the gate voltage rating Vrat is applied by these gate surges, the JFET 301 as a switching element may be broken. In addition, in the mode IIpr and the mode IVpr, which are dead time periods during which both the switching element Q1 and the switching element Q2 are turned off, the reverse conduction loss increases. In addition, at the time of turn-off, since the gate voltage attenuates to 0 V due to an RC time constant, switching noise, for example, Nz0_Q1 increases, and there is a risk of erroneous ignition (malfunction). On the other hand, when the negative bias is increased so as not to cause erroneous ignition, the gate voltage rating Vrat is exceeded due to the gate surge as described above.

On the other hand, in the gate driving circuit 1 which is an application example of the present invention, the breakdown of the switching element due to the turn-off surge is suppressed and the reverse conduction loss is reduced by keeping the gate voltage high at the time of gate turn-off. Furthermore, in the gate driving circuit 1, erroneous ignition is suppressed by keeping the gate voltage low when switching noise occurs.

Figure 3:
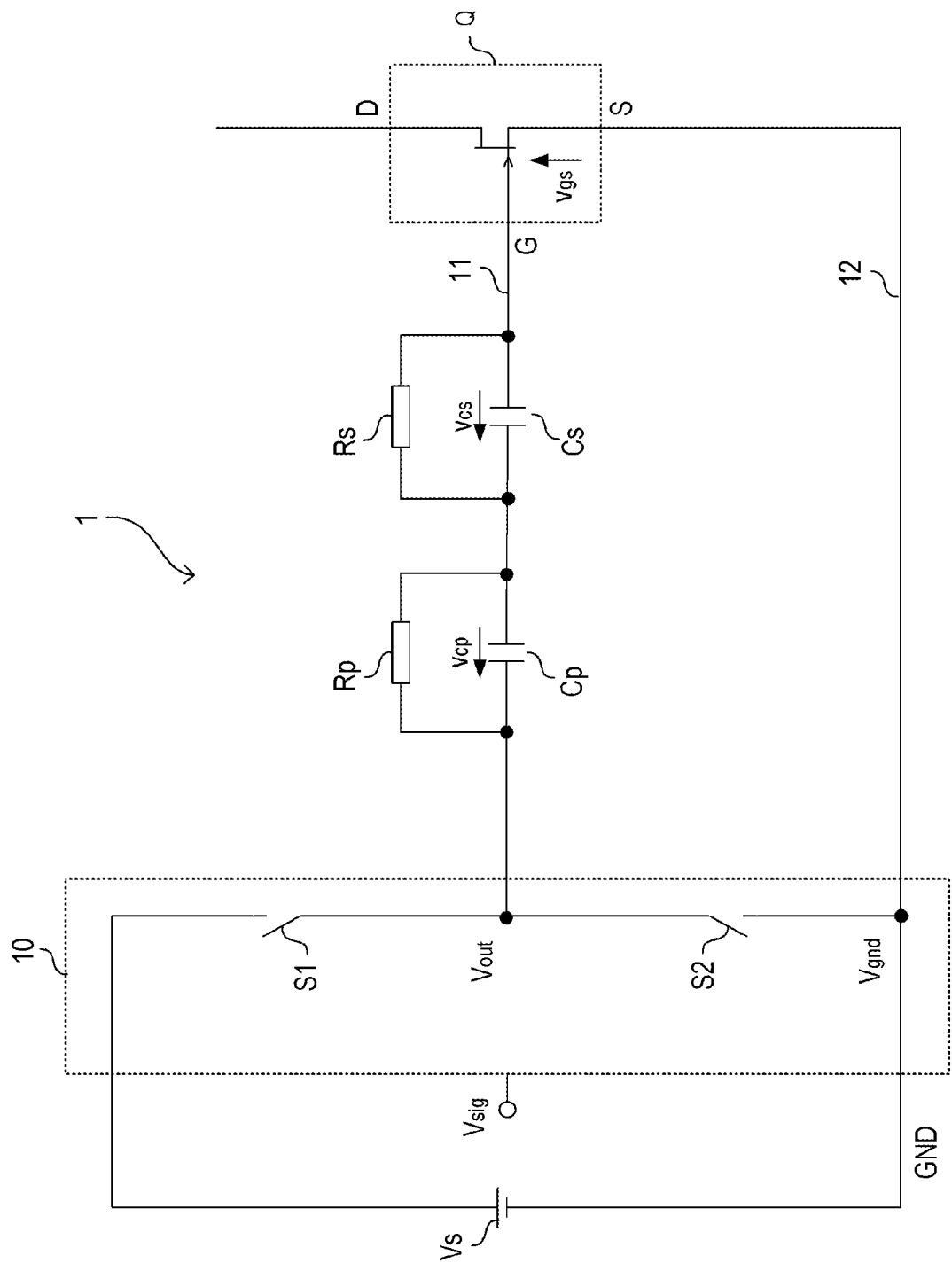
FIG. 3 is a circuit diagram showing a configuration of a gate driving circuit according to a first embodiment of the present invention.

A specific configuration of the gate driving circuit 1 is shown in FIG. 3.

The switch S1 and the switch S2 are connected in series to a DC power supply (gate power supply) Vs. The negative side of the gate power source Vs is connected to the ground (GND). The switch S1 and the switch S2 are opened and closed according to the input signal Vsig. An output terminal Vout is connected to a gate terminal of the switching element Q via a connecting wire 11, and a GND-side terminal of the switch S2 is connected to a source terminal of the switching element Q via a connecting wire 12. Between the gate terminal of the switching element Q and the output terminal Vout, the capacitor Cs and the resistor Rs connected in parallel and the capacitor Cp and the resistor Rp connected in parallel are connected in series from the gate terminal side. The capacitor Cs and the capacitor Cp can generate a negative bias with respect to the gate voltage of the switching element Q.

Figure 4:
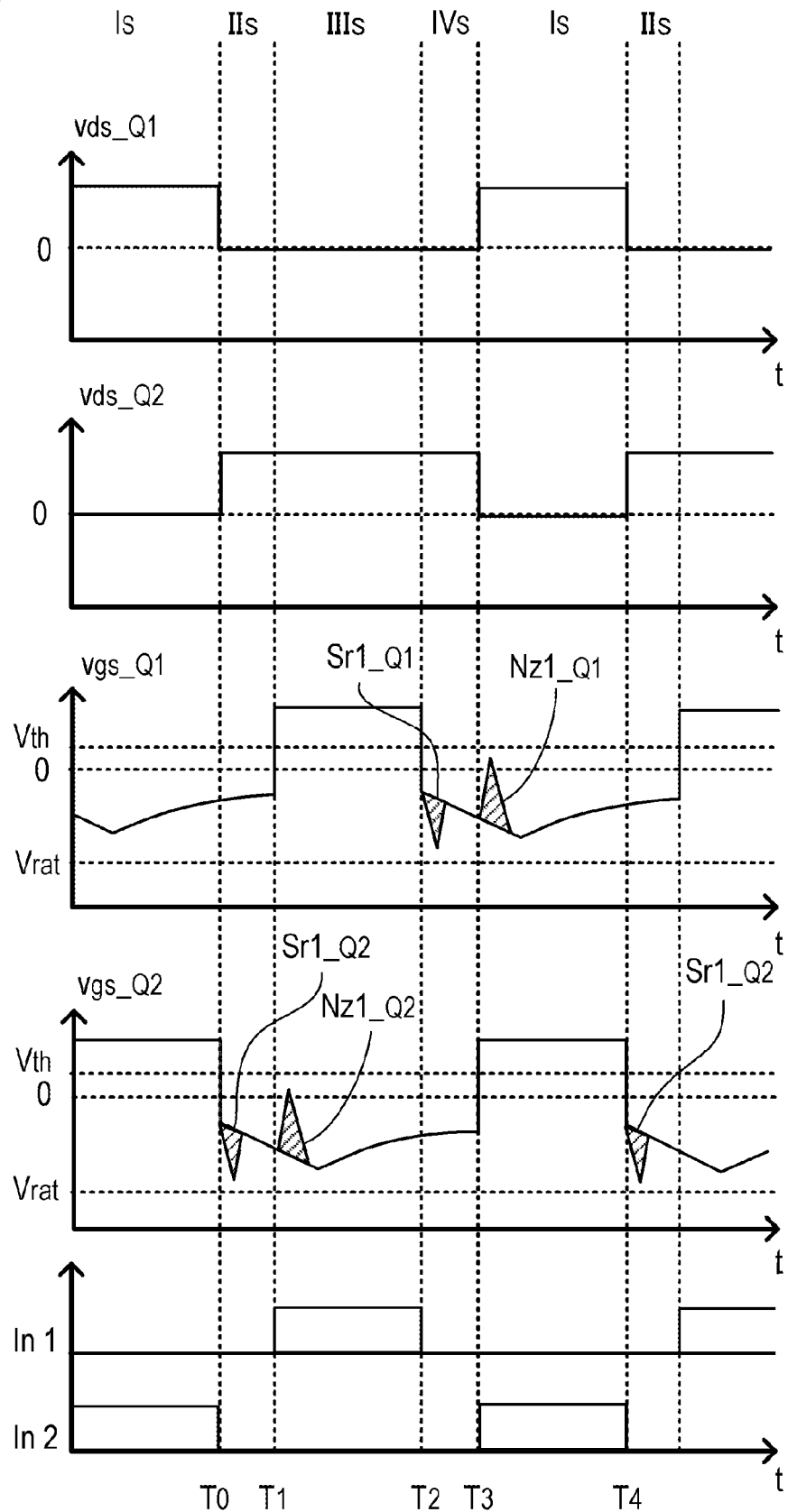
FIG. 4 is an operation sequence diagram of the gate driving circuit according to the first embodiment of the present invention.

FIG. 4 shows an operation sequence of the synchronous rectification-type boost chopper circuit 100 including the gate driving circuit according to a first embodiment as the gate driving circuit GD1 and the gate driving circuit GD2. Here, vds_Q1 and vgs_Q1 represent the drain-source voltage and the gate-source voltage of the switching element Q1, respectively. vds_Q2 and vgs_Q2 represent the drain-source voltage and the gate-source voltage of the switching element Q2, respectively. In1 and In2 represent input signals of the gate driving circuit GD1 and the gate driving circuit GD2, respectively.

By connecting the capacitor Cp and the resistor Rp connected in parallel to the capacitor Cs and the resistor Rs on the side of the switch S1 and the switch S2, the gate voltage (gate-source voltage) when the gate of the switching element Q is turned off can be held high. As a result, as shown in FIG. 4, the surge voltage can be reduced, and breakdown of the switching element Q due to the surge voltage exceeding the rated voltage Vrat can be suppressed. Furthermore, it is possible to keep the gate voltage low when switching noise occurs due to switching of the switching element of the other arm. As a result, as shown in FIG. 4, since the gate voltage does not exceed Vth, erroneous ignition of the switching element Q can be suppressed.

First Embodiment

Hereinafter, a gate driving circuit according to an embodiment of the present invention will be described in more detail with reference to the drawings.

The gate driving circuit according to the present embodiment is a circuit connected to the gate side of the switching element. As the switching element according to the present embodiment, for example, a JFET can be used, but a metal oxide semiconductor field effect transistor (MOSFET) in which a resistor is added between a gate and a source can be used.

Figure 1A:
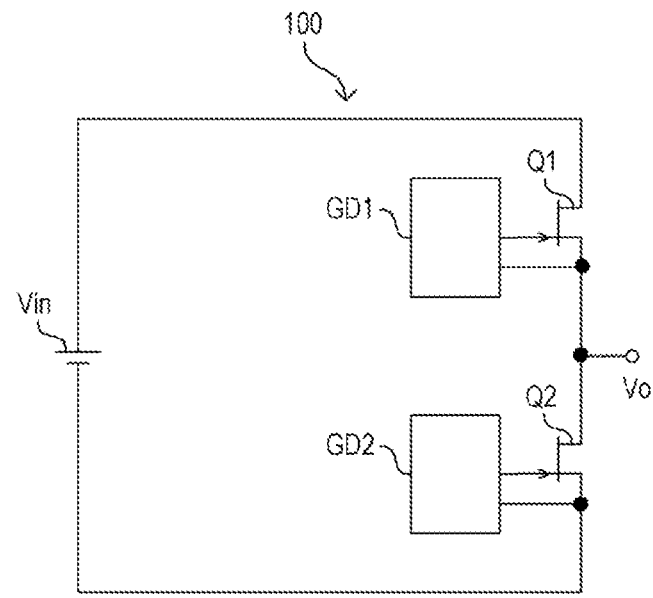
FIGS. 1A and 1B are diagrams showing switching circuits including a gate driving circuit according to an embodiment of the present invention.
Figure 1B:
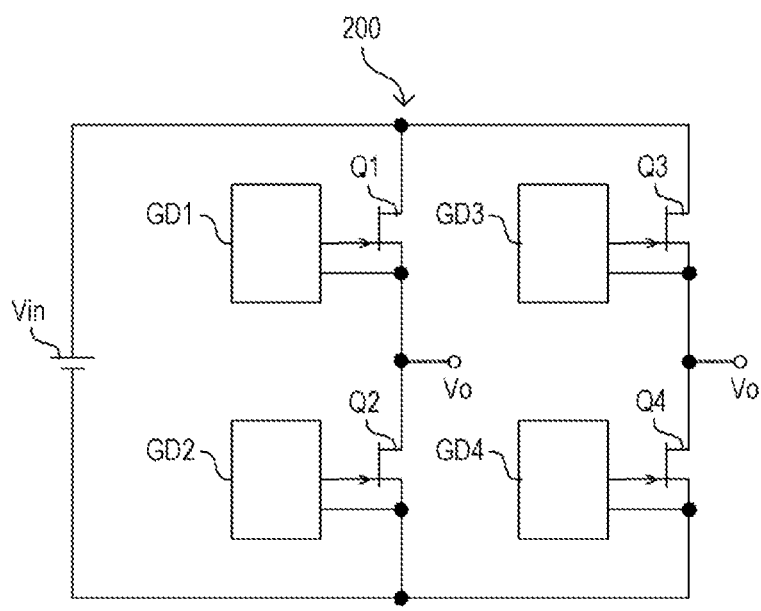

FIG. 1 shows a switching circuit including a switching element including a gate driving circuit according to the present embodiment. FIG. 1A shows the half bridge circuit 100 in which a leg in which two arms including the switching element Q1 and the switching element Q2 are connected in series is connected in series to an input power supply Vin. The switching element Q1 and the switching element Q2 are gate-driven by the gate driving circuit GD1 and the gate driving circuit GD2, respectively. In the full bridge circuit 200, an output terminal Vo is drawn out from the midpoint of two arms included in each leg. FIG. 1B shows a full bridge circuit 200 in which two legs including a leg in which two arms including the switching element Q1 and the switching element Q2 are connected in series and a leg in which two arms including a switching element Q3 and a switching element Q4 are connected in series are connected in parallel to an input power supply. The switching element Q1, the switching element Q2, the switching element Q3, and the switching element Q4 are gate-driven by the gate driving circuit GD1, the gate driving circuit GD2, the gate driving circuit GD3, and the gate driving circuit GD4, respectively. In the full bridge circuit 200, an output terminal Vo is drawn out from the midpoint of two arms included in each leg.

FIG. 2 shows a synchronous rectification-type boost chopper circuit 100 as an example of the half bridge circuit. The synchronous rectification-type boost chopper circuit 100 includes a leg in which arms respectively including a switching element $Q_1$ and a switching element $Q_2$ are connected in series. A gate driving circuit GD1 that drives the gate of the switching element $Q_1$ according to the input signal In1 is connected to a gate terminal and a source terminal of the switching element $Q_1$. A gate driving circuit GD2 that drives the gate of the switching element $Q_2$ according to the input signal In2 is connected to a gate terminal and a source terminal of the switching element $Q_2$.

An input power supply 101 is connected to the midpoint between the source terminal of the switching element $Q_1$ and the drain terminal of the switching element $Q_2$ and the source terminal side of the switching element $Q_2$ in parallel to the switching element $Q_2$. The input power supply 101 is connected such that the midpoint side between the source terminal of the switching element $Q_1$ and the drain terminal of the switching element $Q_2$ is positive and the source terminal side of the switching element $Q_2$ is negative. A polar electrolytic capacitor 102 is connected in parallel to the input power supply 101 such that the positive side of the input power supply 101 becomes positive. An inductance 103 is connected in series between the positive side of the polar electrolytic capacitor 102 and the midpoint between the source terminal of the switching element $Q_1$ and the drain terminal of the switching element $Q_2$.

A load 104 is connected to the drain terminal side of the switching element $Q_1$ and the source terminal side of the switching element $Q_2$ so as to be parallel to the leg. In parallel with the load 104, a polar electrolytic capacitor is connected such that the drain terminal side of the switching element $Q_1$ is positive.

FIG. 3 is a circuit diagram showing a detailed configuration of the gate driving circuit GD1 of the synchronous rectification-type boost chopper circuit 100 shown in FIG. 1. The gate driving circuit GD1 and the gate driving circuit GD2 have the same configuration. "1" and "2" are omitted in the description of the configuration common to both the gate driving circuit GD1 and the gate driving circuit GD2.

The switch S1 and the switch S2 are connected in series to the gate power source Vs. The negative side of the gate power source Vs is connected to the ground (GND). The switch S1 and the switch S2 are opened and closed according to the input signal Vsig. The output terminal Vout, which is a midpoint between the switch S1 and the switch S2, is connected to the gate terminal of the switching element Q by a connecting wire 11, and a GND-side terminal Vgnd of the switch S2 is connected to the source terminal of the switching element Q by a connecting wire 12. The gate driver 10 includes the switch S1, the switch S2, the output terminal Vout, and the GND-side terminal Vgnd. A control signal for the gate terminal of the switching element Q is output from the output terminal Vout of the gate driver 10 by turning on and off the switch S1 and the switch S2. As the switch S1 and the switch S2, for example, a known switching element such as a MOSFET can be used. Here, the gate driver 10 corresponds to a controller of the present invention. The connecting wire 11 and the connecting wire 12 correspond to a first connecting wire and a second connecting wire of the present invention, respectively. The output terminal Vout and the GND-side terminal Vgnd correspond to a first terminal and s second terminal of the present invention, respectively.

Two capacitors respectively connected in parallel with resistors are connected in series between the output terminal Vout of the connecting wire 12 and the gate terminal of the switching element Q. The capacitor Cs and the resistor Rs connected in parallel to the capacitor Cs are disposed on the gate terminal side of the switching element Q. The capacitor Cp and the resistor Rp connected in parallel to the capacitor Cp are disposed on the midpoint side of the switches S1 and S2. The capacitor Cs and the capacitor Cp function as speed-up capacitors that instantaneously charge and discharge the charge of the switching element Q at the time of switching of the switching element Q. In addition, the resistor Rs and the resistor Rp function as limiting resistors for causing a minute current to flow when the switching element Q is turned on. The capacitor Cs and the capacitor Cp can generate a negative bias with respect to the gate voltage of the switching element Q. Here, the capacitor Cs and the resistor Rs correspond to a first capacitor and a first resistor of the present invention, respectively. The capacitor Cp and the resistor Rp correspond to a second capacitor and a second resistor of the present invention, respectively.

FIG. 4 shows an operation sequence of the synchronous rectification-type boost chopper circuit 100 including the gate driving circuit according to a first embodiment as the gate driving circuit GD1 and the gate driving circuit GD2. Here, vds_Q1 and vgs_Q1 represent the drain-source voltage and the gate-source voltage of the switching element Q1, respectively. vds_Q2 and vgs_Q2 represent the drain-source voltage and the gate-source voltage of the switching element Q2, respectively. In1 and In2 represent input signals of the gate driving circuit GD1 and the gate driving circuit GD2, respectively.

By connecting the capacitor Cp and the resistor Rp connected in parallel to the capacitor Cs and the resistor Rs on the side of the switch S1 and the switch S2, the gate voltage (gate-source voltage) when the gate of the switching element Q is turned off can be held high. As a result, the surge voltage can be reduced, and breakdown of the switching element Q due to the surge voltage exceeding the rated voltage Vrat can be suppressed. In FIG. 4, as indicated by waveforms in the mode $IV_s$ for vgs_Q1 and the mode $II_s$ for vgs_Q2, the gate-source voltage at the time of gate turn-off does not exceed the rated voltage Vrat even when the surges Sr1_Q1 and Sr1_Q2 are generated. Furthermore, it is possible to keep the gate voltage low when switching noise occurs due to switching of the switching element of the other arm. As a result, it is possible to suppress erroneous ignition of the switching element Q due to the gate voltage exceeding Vth. In FIG. 4, as shown in the waveforms in the mode Is for the mode vgs_Q1 and the mode $III_s$ for the mode vgs_Q2, the gate-source voltage at the time of occurrence of the switching noises Nz1_Q1 and Nz1_Q2 does not exceed Vth, so that erroneous ignition is suppressed.

Figure 5A:
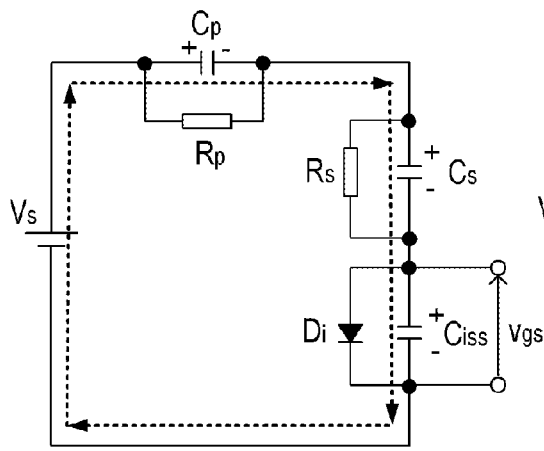
FIGS. 5A to 5E are diagrams for explaining a transition of a current path in the gate driving circuit according to the first embodiment of the present invention.
Figure 5B:
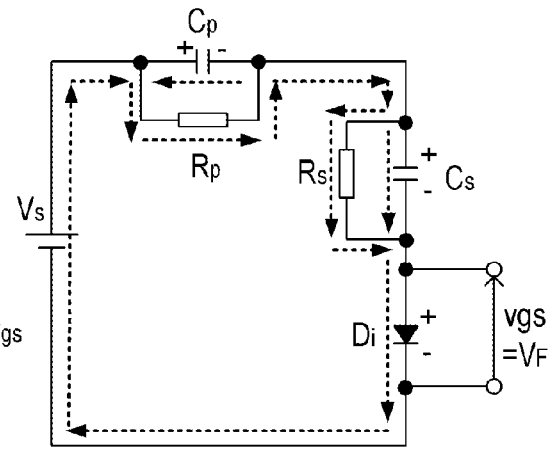
Figure 5C:
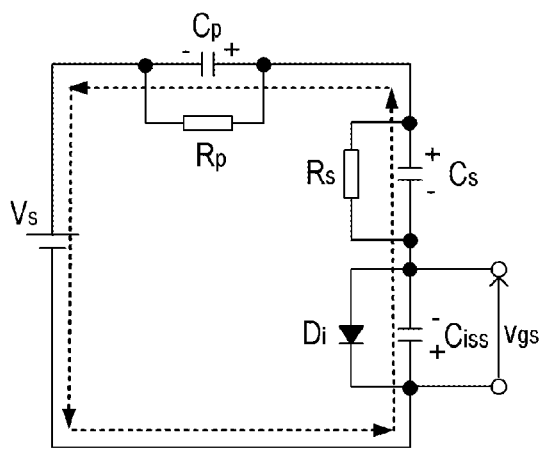
Figure 5D:
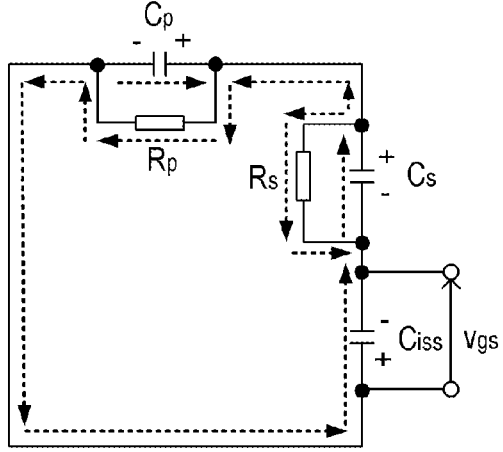
Figure 5E:
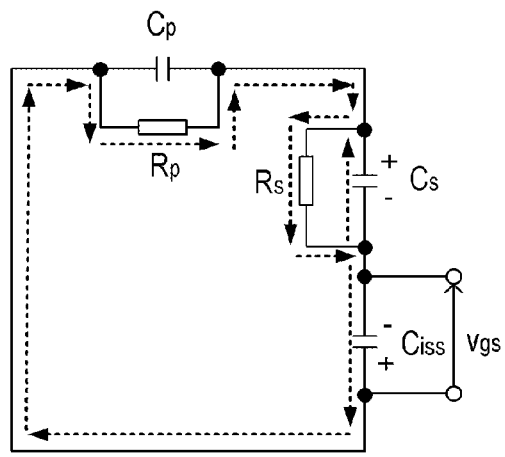
Figure 6:
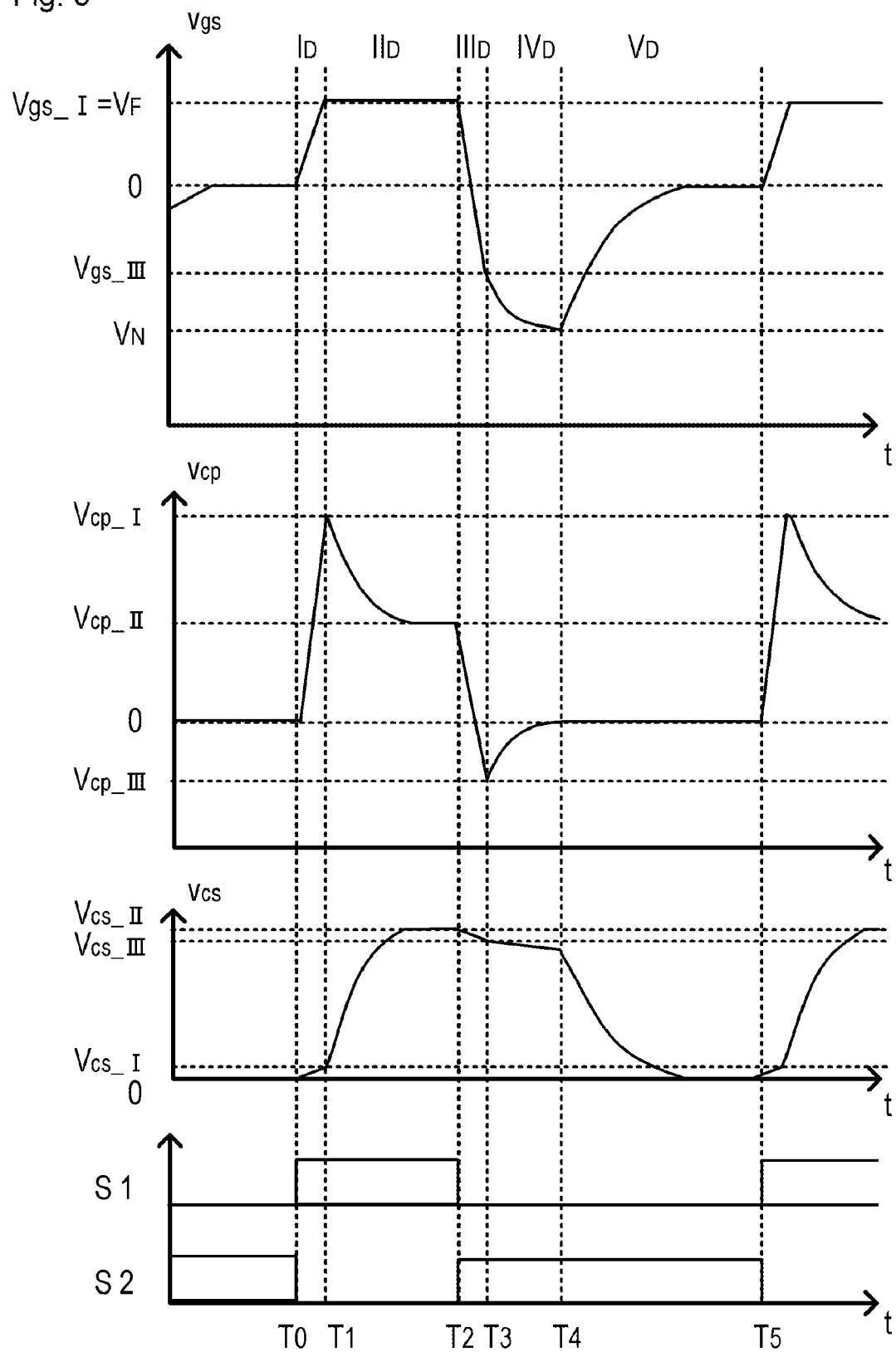
FIG. 6 is a sequence diagram showing details of an operation of the gate driving circuit according to the first embodiment of the present invention.

Next, an operation principle of the gate driving circuit 1 according to the first embodiment will be described in detail. FIGS. 5A to 5E are diagrams for explaining a transition of a current path in the gate driving circuit. FIG. 6 is a graph showing changes in the gate-source voltage vgs, the voltage vcp of the capacitor Cp, and the voltage vcs of the capacitor Cs due to on/off of the switches S1 and S2.

The mode $I_D$ will be described. A current path in the mode $I_D$ is shown in FIG. 5A. Here, the switching element Q is represented by a parasitic diode Di and an input capacitance Ciss connected in parallel thereto. First, the switch S1 of the gate driver is turned on at time $T_0$. At this time, the current supplied from the gate power supply Vs passes through the capacitor Cp and the capacitor Cs to charge the input capacitance Ciss of the switching element Q. As the input capacitance Ciss of the switching element Q is charged, the gate-source voltage vgs of the switching element Q increases, and the state transitions to the turn-on state as shown in FIG. 6.

Next, the mode $II_D$ will be described. A current path in the mode $II_D$ is shown in FIG. 5B. The mode $II_D$ is a period in which the input capacitance Ciss of the switching element Q is charged and the switching element Q is turned on at time $T_1$. At this time, the gate-source voltage vgs is clamped to a constant voltage $V_F$ by the parasitic diode Di of the switching element Q as shown in FIG. 6.

Next, the mode $III_D$ will be described. A current path in the mode $III_D$ is shown in FIG. 5C. Here, the switch S1 is turned off and the switch S2 is turned on at time $T_2$. As a result, as shown in FIG. 6, the input capacitance Ciss of the switching element Q is discharged through the capacitor Cp and the capacitor Cs, and the state transitions to the turn-off state. As shown in FIG. 6, since the gate-source voltage vgs of the switching element Q is turned off at a high voltage, the gate surge can be reduced, and the breakdown of the switching element Q can be suppressed.

Next, the mode $IV_D$ will be described. A current path in the mode $IV_D$ is shown in FIG. 5D. At this time, the input capacitance Ciss, the capacitor Cp, and the capacitor Cs of the switching element Q are charged and discharged through the resistor Rp and the resistor Rs. As shown in FIG. 6, since the gate-source voltage vgs of the switching element Q holds a high voltage, the reverse conduction loss can be reduced.

Next, the mode $V_D$ will be described. A current path in the mode $V_D$ is shown in FIG. 5E. At this time, the input capacitance Ciss and the capacitor Cs of the switching element Q are discharged through the resistor Rs and the resistor Rp. As shown in FIG. 6, the gate-source voltage vgs of the switching element Q shifts in the 0V direction by the RC time constant.

(Simulation)

Figure 7:
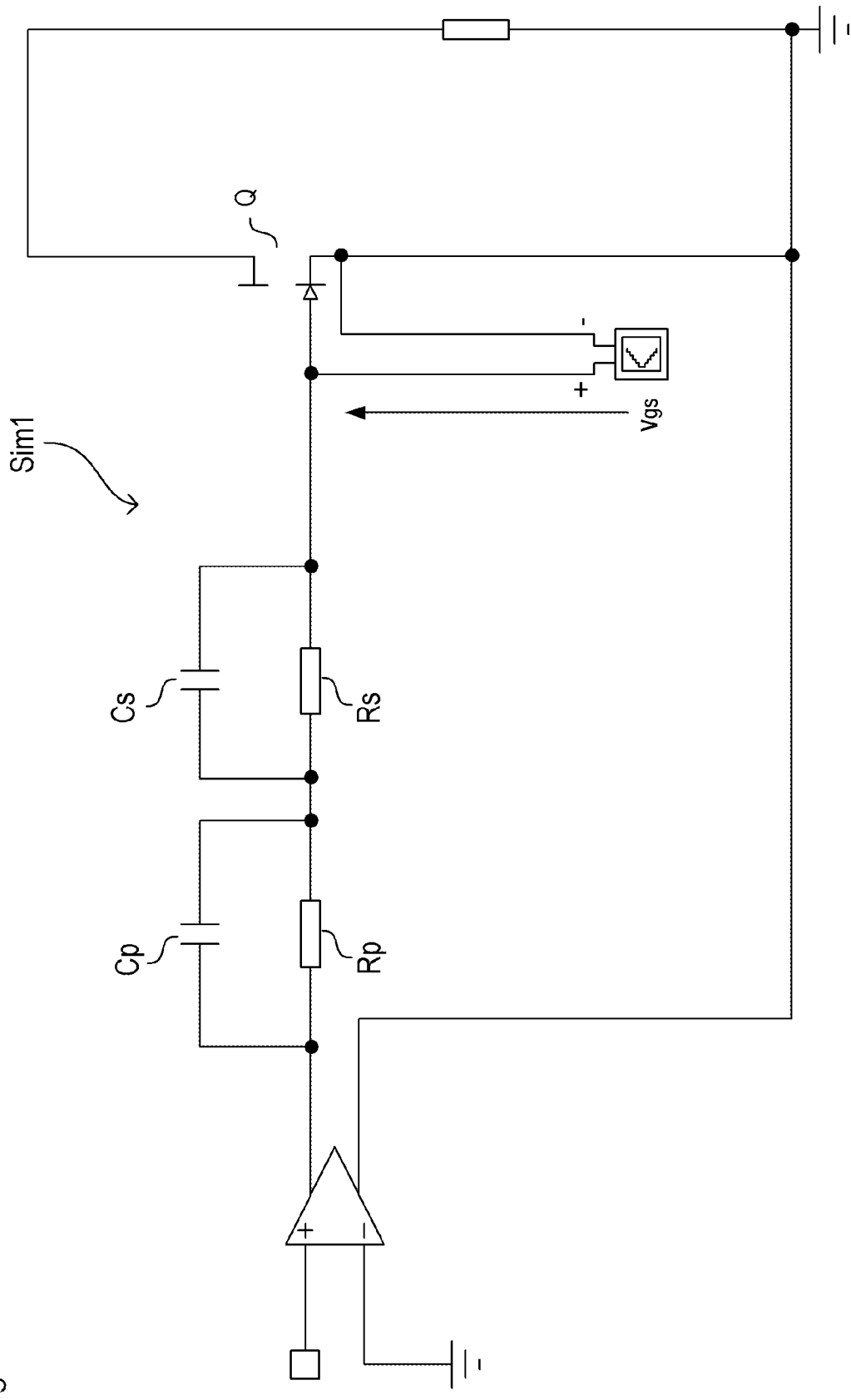
FIG. 7 is a diagram showing a circuit model corresponding to the gate driving circuit according to the first embodiment of the present invention.

Next, a gate driving circuit Sim1 shown in FIG. 7 was created as a model corresponding to the gate driving circuit 1 according to the first embodiment, and the effect of negative bias was confirmed using circuit simulator software.

In the circuit simulator software, simulation was performed with the gate voltage set to 12 V, the driving frequency set to 100 kHz, the duty ratio set to 50%, the resistance value of the resistor Rp set to 130Ω, the resistance value of the resistor Rs set to 200Ω, the capacitance of the capacitor Cp set to 600 pF, and the capacitance of the capacitor Cs set to 22 nF.

Figure 8:
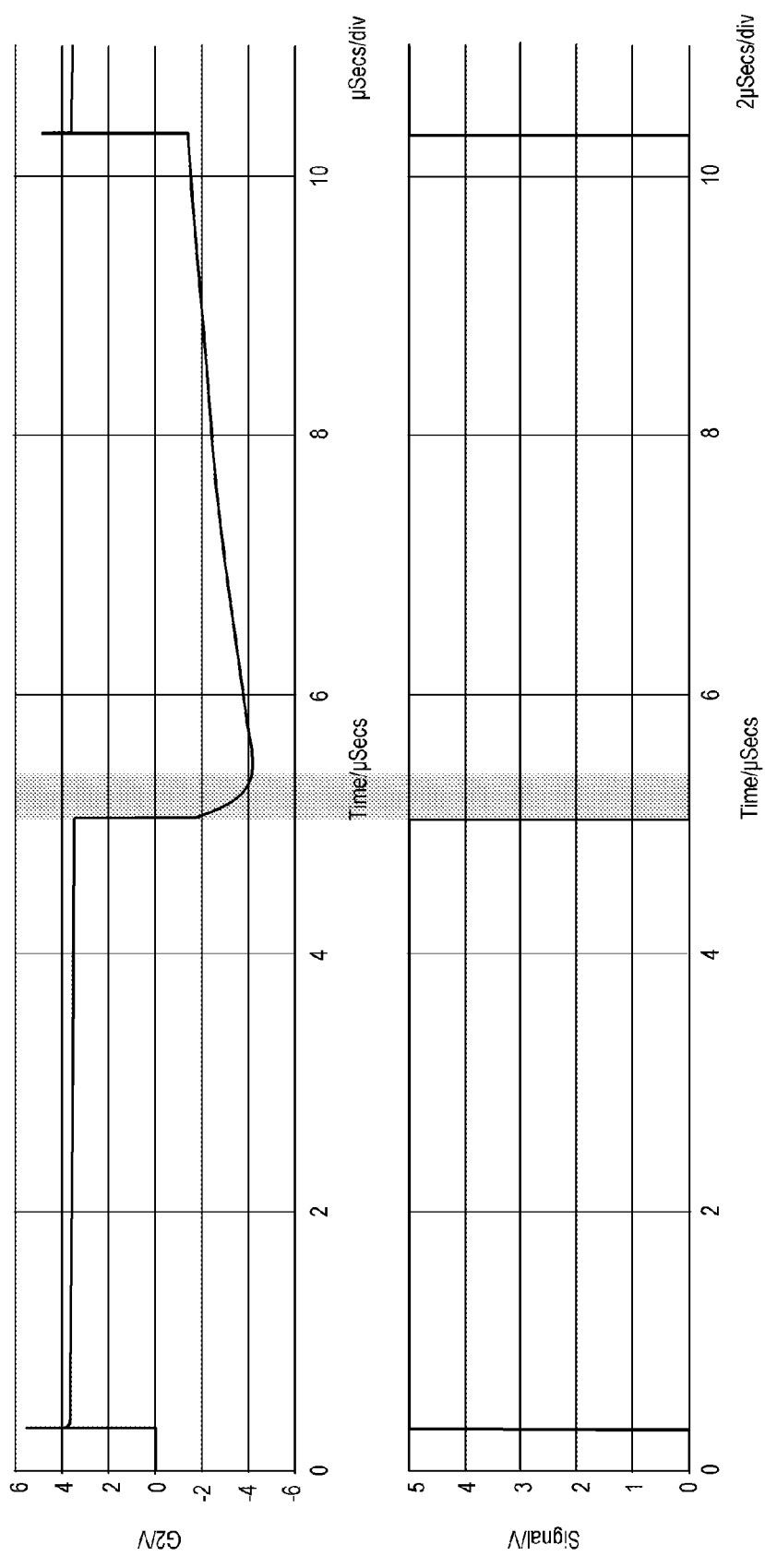
FIG. 8 is a graph showing a simulation result of the gate driving circuit according to the first embodiment of the present invention.

The upper part of FIG. 8 shows a change in the gate voltage vgs of the switching element Q, and the lower part of FIG. 8 shows a change in the input signal Vsig. As indicated by hatching in FIG. 8, it can be confirmed that, when the switching element Q is turned off (when the input signal Vsig is turned off), the gate voltage vgs is turned off at a high voltage.

(Full Bridge Circuit)

Figure 9:
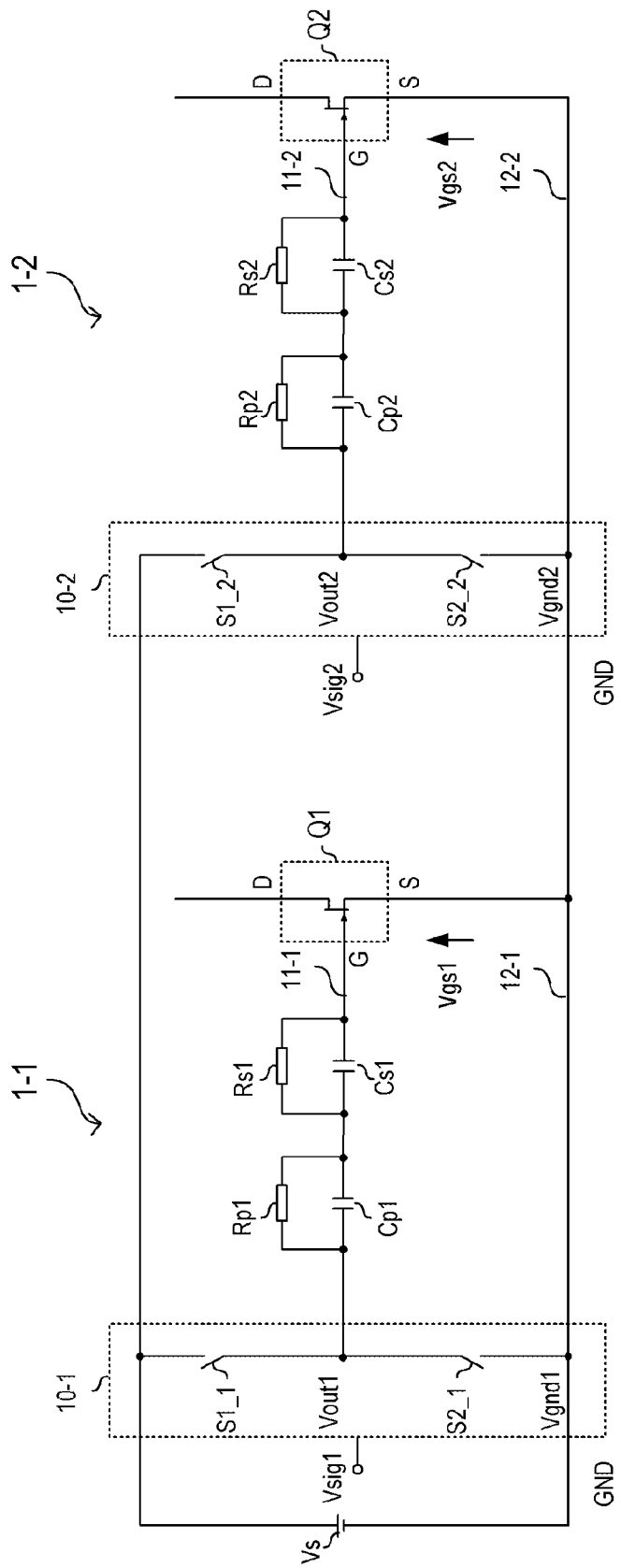
FIG. 9 is a diagram showing a configuration of a full bridge circuit according to the first embodiment of the present invention.

Although the case where the gate driving circuit 1 according to the present embodiment is used as the gate driving circuit for the switching element Q1 and the switching element Q2 constituting the opposing arm of one leg of the half bridge circuit as shown in FIG. 2 has been described, the gate driving circuit 1 can also be used as a gate driving circuit for a switching element included in a full bridge circuit having two legs as shown in FIG. 1B. FIG. 9 is a diagram showing only lower arms of two legs of such a full bridge circuit. Here, the left arm includes the switching element Q1 and the right arm includes the switching element Q2. The components of the gate driving circuit 1-1 and the gate driving circuit 1-2 for each of the switching element Q1 and the switching element Q2 are denoted by 1 or 2 after the reference numeral. Since each component is the same as that of the gate driving circuit 1 described above, the description thereof will be omitted. Here, the gate driving circuit 1-1 for the switching element Q1 and the gate driving circuit 1-2 for the switching element Q2 are operated by the same gate power supply Vs.

As described above, when the gate driving circuit 1 is applied to the gate drive of the switching element of the full bridge circuit, the capacitor and the resistor do not exist between the source terminal of each of the switching element Q1 and the switching element Q2 and the negative terminal of the gate power supply Vs, so that the mutual interference does not occur between the gate driving circuit 1-1 and the gate driving circuit 1-2. For example, a current flows in a path indicated by a broken line in FIG. 10A at the moment when the switching element Q1 is turned on (at the time of gate turn-on), and a current flows in a path indicated by a broken line in FIG. 10B at the moment when the switching element Q1 is turned off (at the time of gate turn-off). Therefore, noise of a gate-source voltage does not increase, and a negative bias value does not interfere. When the capacitor and the resistor exist between the source terminal of each of the switching element Q1 and the switching element Q2 and the negative terminal of the gate power supply Vs, the capacitor on the side of the switching element Q2 is charged because the current also flows to the other (in the above example, a connecting wire 12-2 of the gate driving circuit 1-2) due to the parasitic inductance of the wiring. As a result, interference occurs in which the noise of the switching element Q2 and the noise of the gate-source voltage vgs2 increase or the negative bias is affected. Since such mutual interference does not occur even when the gate driving circuit 1 is used to drive the gate of the switching element of the full bridge circuit, it is possible to suppress an increase in noise in the gate-source voltage and interference of a negative bias value as described above.

Figure 11:
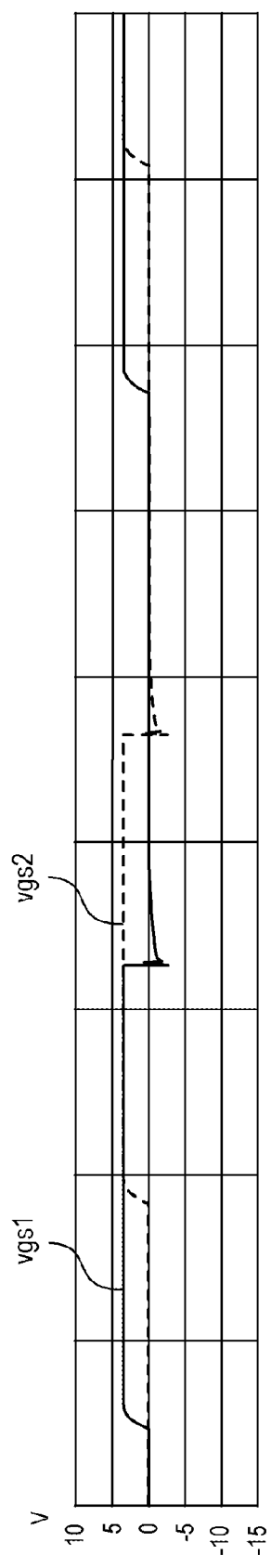
FIG. 11 is a graph showing a gate-source voltage in the full bridge circuit according to the first embodiment of the present invention.

In FIG. 11, the gate-source voltage vgs1 of the switching element Q1 is indicated by a solid line, and the gate-source voltage vgs2 of the switching element Q2 is indicated by a broken line. As described above, neither the gate-source voltage vgs1 nor the gate-source voltage vgs2 shows an increase in noise or interference of a negative bias value.

Second Embodiment

Next, a gate driving circuit 2 according to a second embodiment of the present invention will be described. Configurations common to the first embodiment are denoted by the same reference numerals, and detailed descriptions thereof will be omitted. The gate driving circuit 2 according to the present embodiment can be applied as a gate driving circuit GD1 and a gate driving circuit GD2 that drive the gates of the switching element $Q_1$ and the switching element $Q_2$ of the switching circuit and the synchronous rectification-type boost chopper circuit 100 shown in FIGS. 1 and 2, respectively. In addition, the gate driving circuit 2 can also be applied to gate drive of a switching element constituting a full bridge circuit as shown in FIG. 12.

Figure 12:
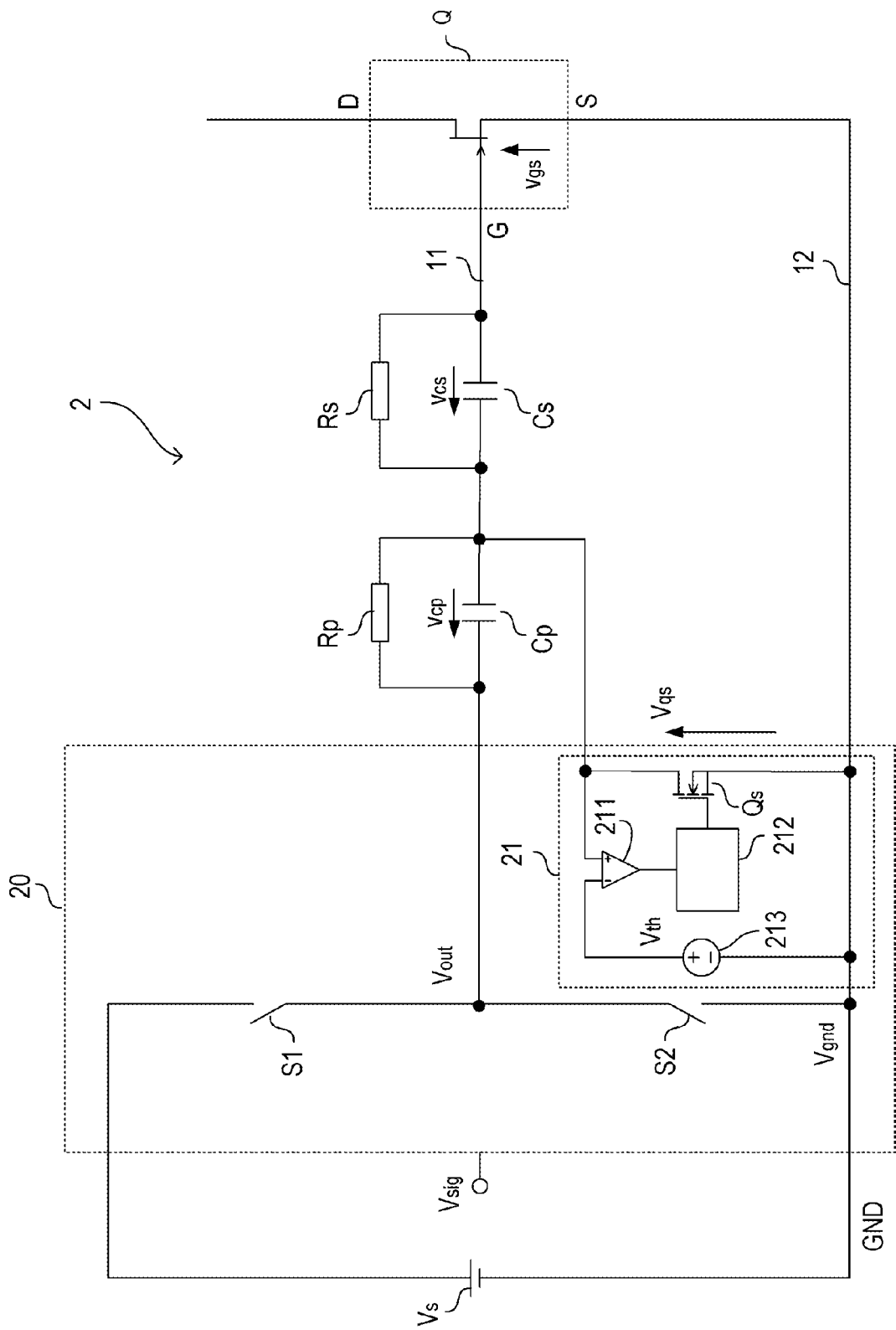
FIG. 12 is a circuit diagram showing a configuration of a gate driving circuit according to a second embodiment of the present invention.
Figure 13:
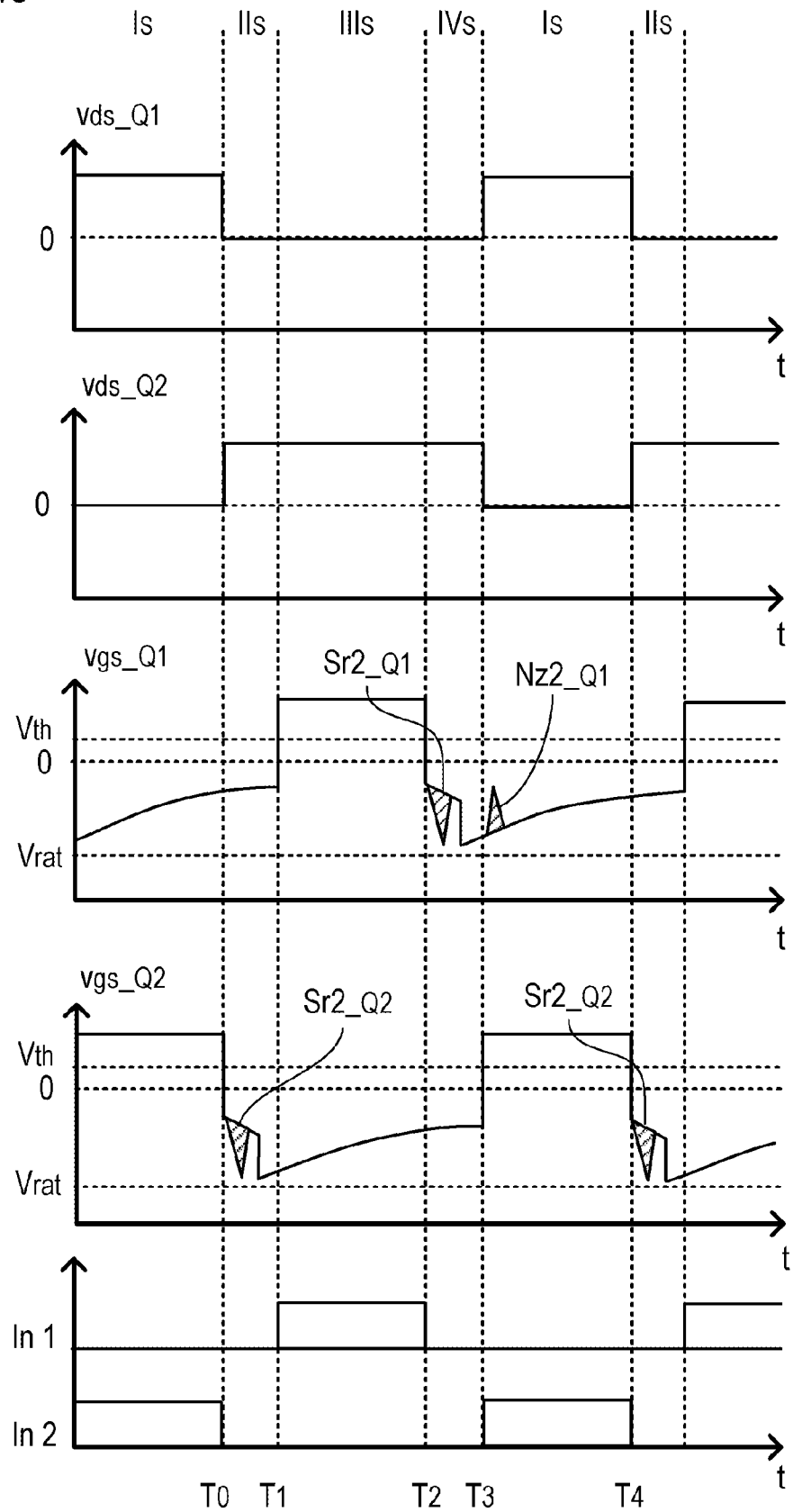
FIG. 13 is an operation sequence diagram of the gate driving circuit according to the second embodiment of the present invention.

FIG. 12 shows the gate driving circuit 2 according to the present embodiment. The gate driving circuit 2 according to the present embodiment has a configuration in which a mirror clamp circuit 21 is added to the gate driving circuit 1 according to the first embodiment. FIG. 13 shows an operation sequence of the synchronous rectification-type boost chopper circuit 100 including the gate driving circuit 2 according to the second embodiment as the gate driving circuit GD1 and the gate driving circuit GD2.

The mirror clamp circuit 21 includes a switching element Qs which is an N-channel MOSFET, a comparator 211, a clamp logic circuit unit 212, and a constant voltage source 213. An inverting input terminal of the comparator 211 and a drain terminal of the switching element Qs are connected to a connecting wire 11 between an output terminal Vout and a gate terminal of a switching element Q between a capacitor Cs and a capacitor Cp. A non-inverting input terminal of the comparator 211 is connected to a positive terminal of the constant voltage source 213 that outputs the voltage Vth. An output terminal of the comparator 211 is connected to an input terminal of the clamp logic circuit unit 212. A negative terminal of the constant voltage source 213 is connected to a connecting wire 12. A gate terminal of a switching element Qs is connected to an output terminal of the clamp logic circuit unit 212, and a source terminal is connected to the connecting wire 12. A gate driver 20 includes a switch S1, a switch S2, an output terminal Vout, a GND-side terminal Vgnd, and a mirror clamp circuit 21.

The comparator 211 outputs a High signal from the output terminal when the voltage input to the non-inverting input terminal, that is, the voltage between the midpoint of the capacitor Cs and the capacitor Cp is larger than the threshold Vth input to the inverting input terminal, and outputs a Low signal from the output terminal when the voltage input to the non-inverting input terminal is smaller than the voltage input to the inverting input terminal. When a Low signal is input from the comparator 211, the clamp logic circuit unit 212 turns on the switching element Qs.

As described above, in the gate driving circuit 2 according to the second embodiment, by adding the mirror clamp circuit 21 to the configuration of the first embodiment, the gate voltage of the switching element Q can be changed in two stages as seen in vds_Q1 in the mode $IV_s$ of FIG. 13 (the same applies to vds_Q2 in the mode $II_s$). Therefore, as compared with the gate driving circuit 1 according to the first embodiment, the gate voltage of the switching element Q when switching noise occurs can be kept low as seen in the waveform of vgs_Q1 at time T3 when the switching element Q2 is turned on. In addition, the switching element Qs of the mirror clamp circuit 21 can reduce the impedance of the mirror current. As a result, switching noise can be reduced.

Figure 14A:
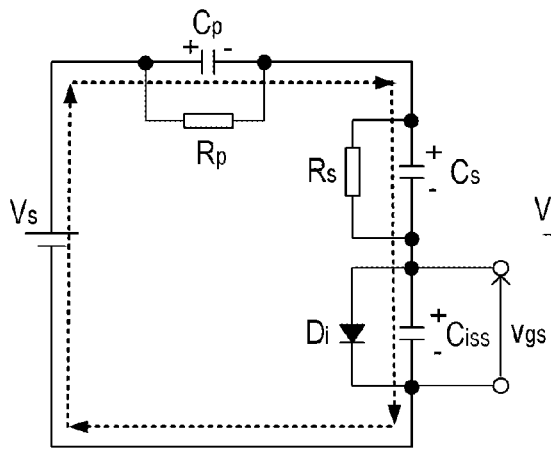
FIGS. 14A to 14F are diagrams for explaining a transition of a current path in the gate driving circuit according to the second embodiment of the present invention.
Figure 14B:
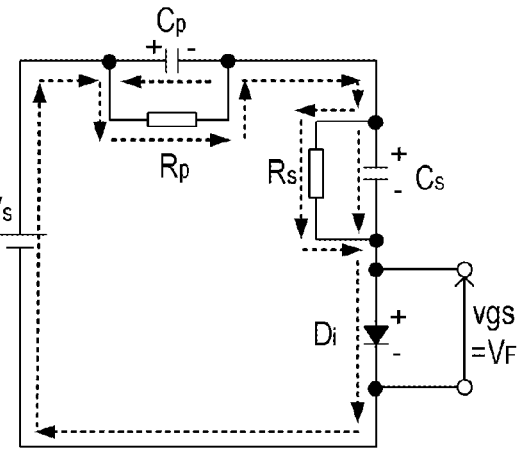
Figure 14C:
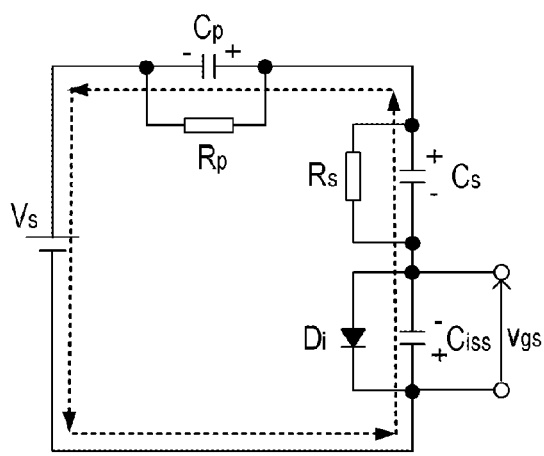
Figure 14D:
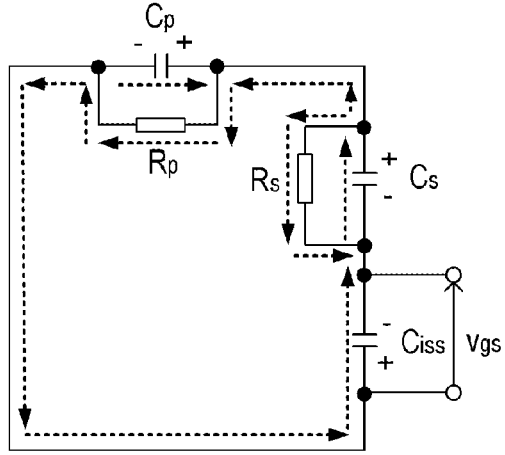
Figure 14E:
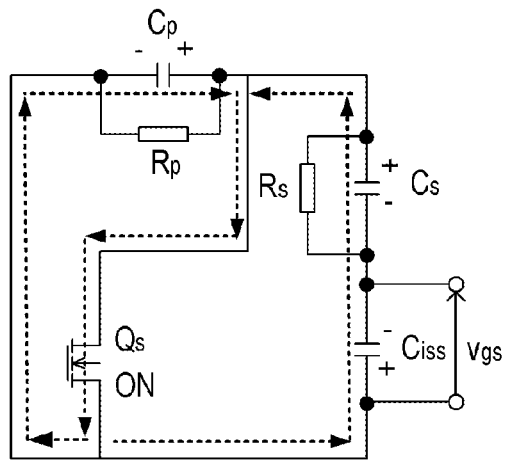
Figure 15:
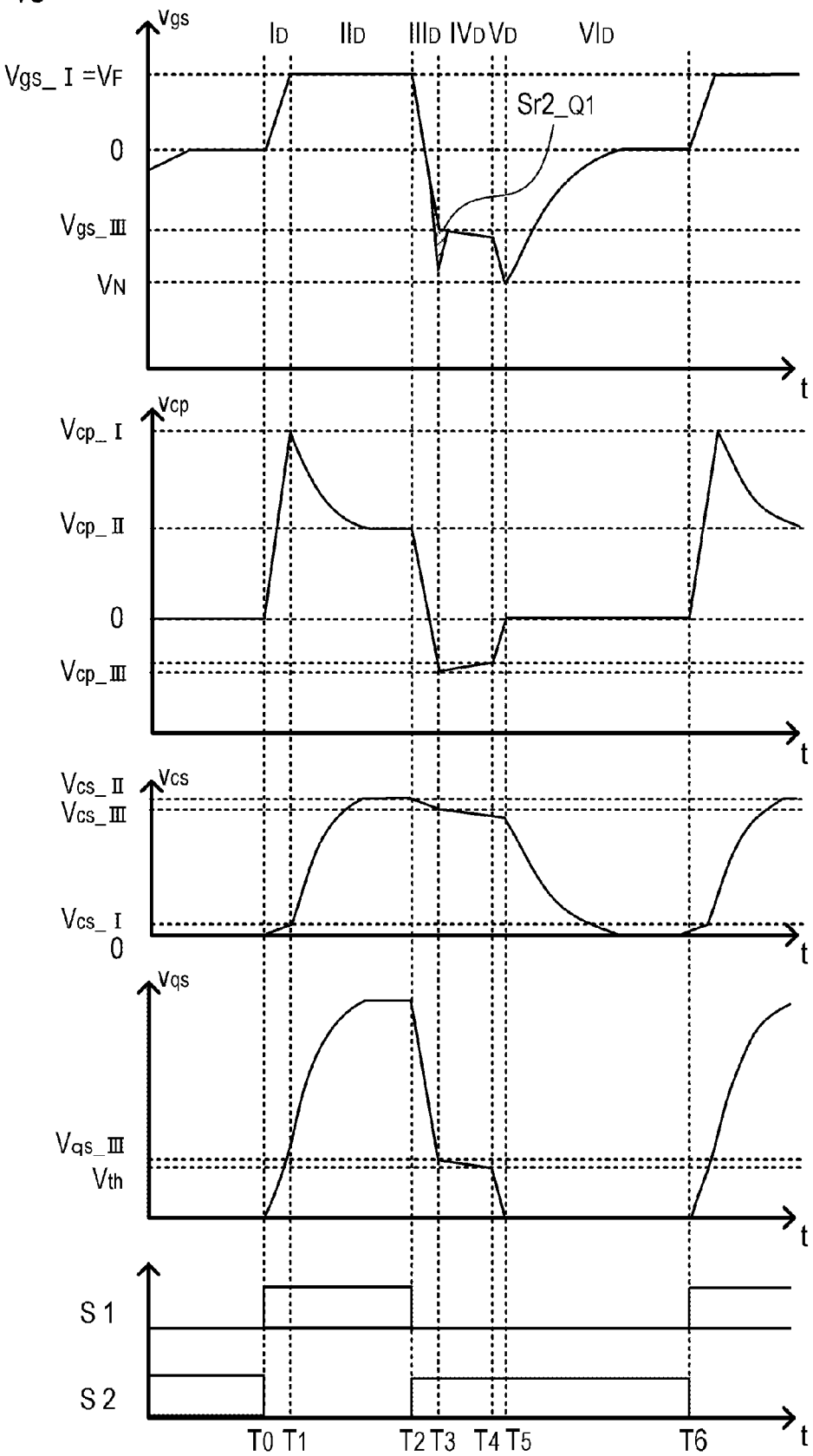
FIG. 15 is a sequence diagram showing details of an operation of the gate driving circuit according to the second embodiment of the present invention.

Next, an operation principle of the gate driving circuit 2 according to the second embodiment will be described in detail. FIGS. 14A to 14E are diagrams for explaining a transition of a current path in the gate driving circuit. FIG. 15 is a graph showing changes in the gate-source voltage vgs, the voltage vcp of the capacitor Cp, the voltage vcs of the capacitor Cs, and the voltage vqs of the switching element Qs due to on/off of the switches S1 and S2.

The mode $I_D$ will be described. A current path in the mode $I_D$ is shown in FIG. 14A. Here, the switching element Q is represented by a parasitic diode Di and an input capacitance Ciss connected in parallel thereto. First, the switch S1 of the gate driver is turned on at time $T_0$. At this time, the current supplied from the gate power supply Vs passes through the capacitor Cp and the capacitor Cs to charge the input capacitance Ciss of the switching element Q. As the input capacitance Ciss of the switching element Q is charged, the gate-source voltage vgs of the switching element Q increases, and the state transitions to the turn-on state as shown in FIG. 15.

Next, the mode $II_D$ will be described. A current path in the mode $II_D$ is shown in FIG. 14B. The mode $II_D$ is a period in which the input capacitance Ciss of the switching element Q is charged and the switching element Q is turned on at time $T_1$. At this time, the gate-source voltage vgs is clamped to a constant voltage VF by the parasitic diode Di of the switching element Q as shown in FIG. 15.

Next, the mode $III_D$ will be described. A current path in the mode $III_D$ is shown in FIG. 14C. Here, the switch S1 is turned off and the switch S2 is turned on at time T2. As a result, as shown in FIG. 14C, the input capacitance Ciss of the switching element Q is discharged through the capacitor Cp and the capacitor Cs, and the state transitions to the turn-off state. As shown in FIG. 15, since the gate-source voltage vgs of the switching element Q is turned off at a high voltage, the gate surge can be reduced, and the breakdown of the switching element Q can be suppressed.

$V_{cp\_II}$ and $V_{cs\_II}$ are voltages across the capacitor Cp and the capacitor Cs at the end of the mode $II_D$, respectively, and $V_{qs\_III}$ and $V_{cp\_III}$ are a drain-source voltage of the switching element Qs of the mirror clamp circuit 21 and a voltage across the capacitor Cp at the end of the mode $III_D$, respectively. In addition, $Q_g$ and $C_{iss}$ are the gate charge amount and the input capacitance of the switching element Q. $C_p$ and $C_s$ are the capacitances of the capacitor Cp and the capacitor Cs, respectively. The following equation is established between these physical quantities and the threshold voltage Vth at which the switching element Qs of the mirror clamp circuit 21 is turned on.

[Equation 1]
$$V_{qs\_III} = -V_{cp\_III} = \frac{C_s[V_{cp\_II} \cdot C_p - Q_g] + C_{iss}[V_{cp\_II} \cdot C_p - V_{cs\_II} \cdot C_s]}{(C_p \cdot C_s + C_s \cdot C_{iss} + C_{iss} \cdot C_p)} > Vth$$

Next, the mode $IV_D$ will be described. A current path in the mode $IV_D$ is shown in FIG. 14D. At this time, the input capacitance Ciss, the capacitor Cp, and the capacitor Cs of the switching element Q are charged and discharged through the resistor Rp and the resistor Rs. As shown in FIG. 15, since the gate-source voltage vgs of the switching element Q holds a high voltage, the reverse conduction loss can be reduced.

Next, the mode $V_D$ will be described. A current path in the mode $V_D$ is shown in FIG. 14E. When the drain-source voltage of the switching element Qs becomes equal to or lower than Vth, the switching element Qs shifts to a conductive state. This achieves two-stage turn-off of the switching element Q across the mode $IV_D$ and the mode $V_D$. As described above, the drain terminal of the switching element Qs is connected to the midpoint between the capacitor Cs and the capacitor Cp, and the source terminal is connected to the connecting wire 12. By increasing the negative bias value of the switching element Q, it is possible to prevent malfunction due to switching noise at the time of switching of the switching element of the opposing arm.

Figure 14F:
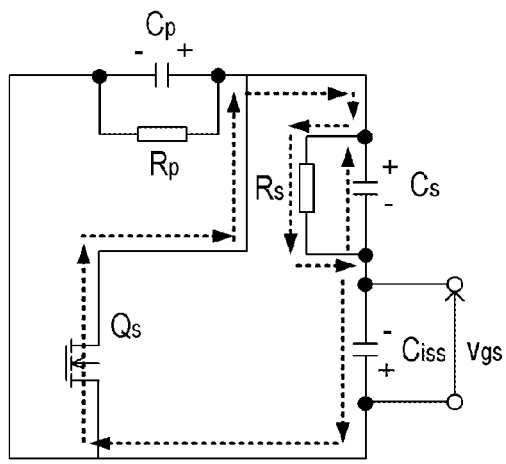

Next, the mode $VI_D$ will be described. A current path in the mode $VI_D$ is shown in FIG. 14F. At this time, the input capacitance Ciss and the capacitor Cs of the switching element Q are discharged through the resistor Rs and the switching element Qs turned on. As shown in FIG. 15, the gate-source voltage vgs of the switching element Q shifts in the 0 V direction by an RC time constant.

(Simulation)

Figure 16:
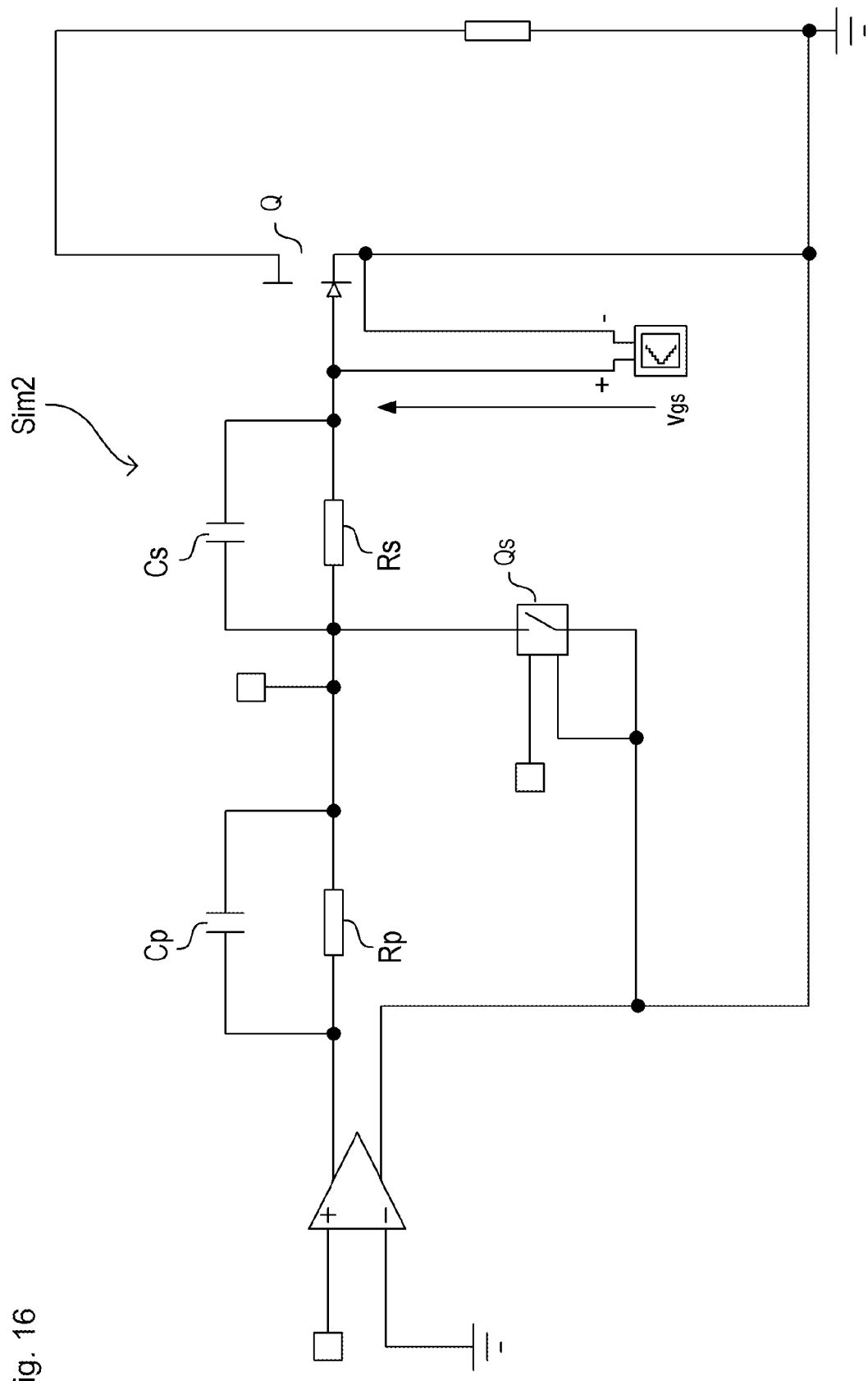
FIG. 16 is a diagram showing a circuit model corresponding to the gate driving circuit according to the second embodiment of the present invention.

Next, a gate driving circuit Sim2 shown in FIG. 16 was created as a model corresponding to the gate driving circuit 2 according to the second embodiment, and the effect of negative bias was confirmed using simulator software.

In the circuit simulator software, as in the case of the first embodiment, simulation was performed with the gate voltage set to 12 V, the driving frequency set to 100 kHz, the duty ratio set to 50%, the resistance value of the resistor Rp set to 130Ω, the resistance value of the resistor Rs set to 200Ω, the capacitance of the capacitor Cp set to 600 pF, and the capacitance of the capacitor Cs set to 22 nF.

Figure 17:
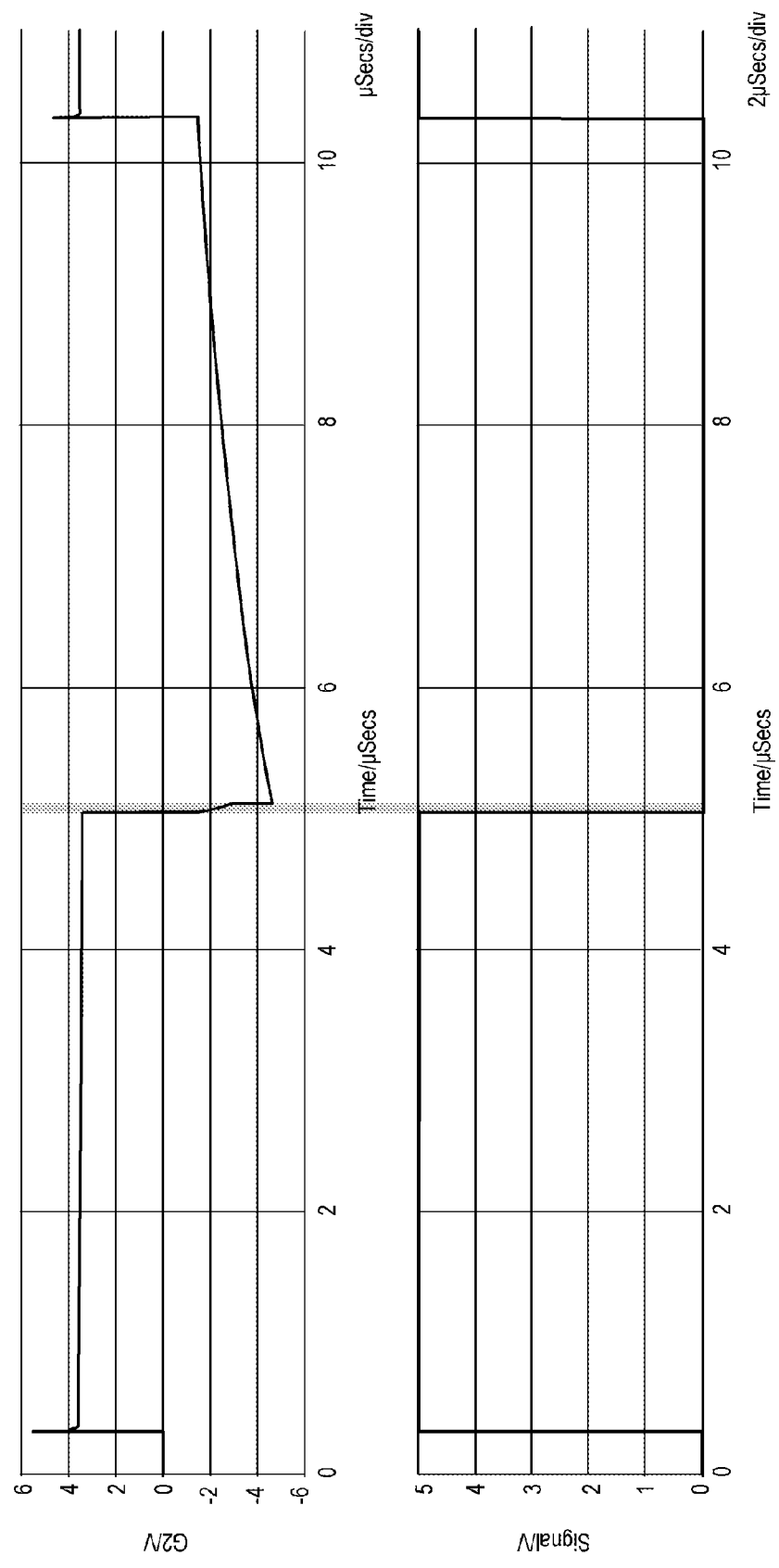
FIG. 17 is a graph showing a simulation result of the gate driving circuit according to the second embodiment of the present invention.

The upper part of FIG. 17 shows a change in the gate voltage vgs of the switching element Q, and the lower part of FIG. 17 shows a change in the input signal Vsig. As indicated by hatching in FIG. 17, it can be confirmed that, when the switching element Q is turned off (when the input signal Vsig is turned off), the gate voltage vgs is turned off at a high voltage. It can be seen that when the switching element Qs of the mirror clamp circuit conducts, the gate voltage vgs sharply attenuates. For example, by lowering the gate-source voltage vgs at the time of switching of the switching element of the opposing arm, switching noise can be reduced and malfunction can be suppressed.

Third Embodiment

Next, a gate driving circuit 3 according to a third embodiment of the present invention will be described. Configurations common to the first and second embodiments are denoted by the same reference numerals, and detailed descriptions thereof will be omitted. The gate driving circuit according to the present embodiment can be applied as a gate driving circuit GD1 and a gate driving circuit GD2 that drive the gates of the switching element $Q_1$ and the switching element $Q_2$ of the switching circuit and the synchronous rectification-type boost chopper circuit 100 shown in FIGS. 1 and 2, respectively. In addition, the gate driving circuit 3 can also be applied to gate drive of a switching element constituting a full bridge circuit as shown in FIG. 9.

Figure 18:
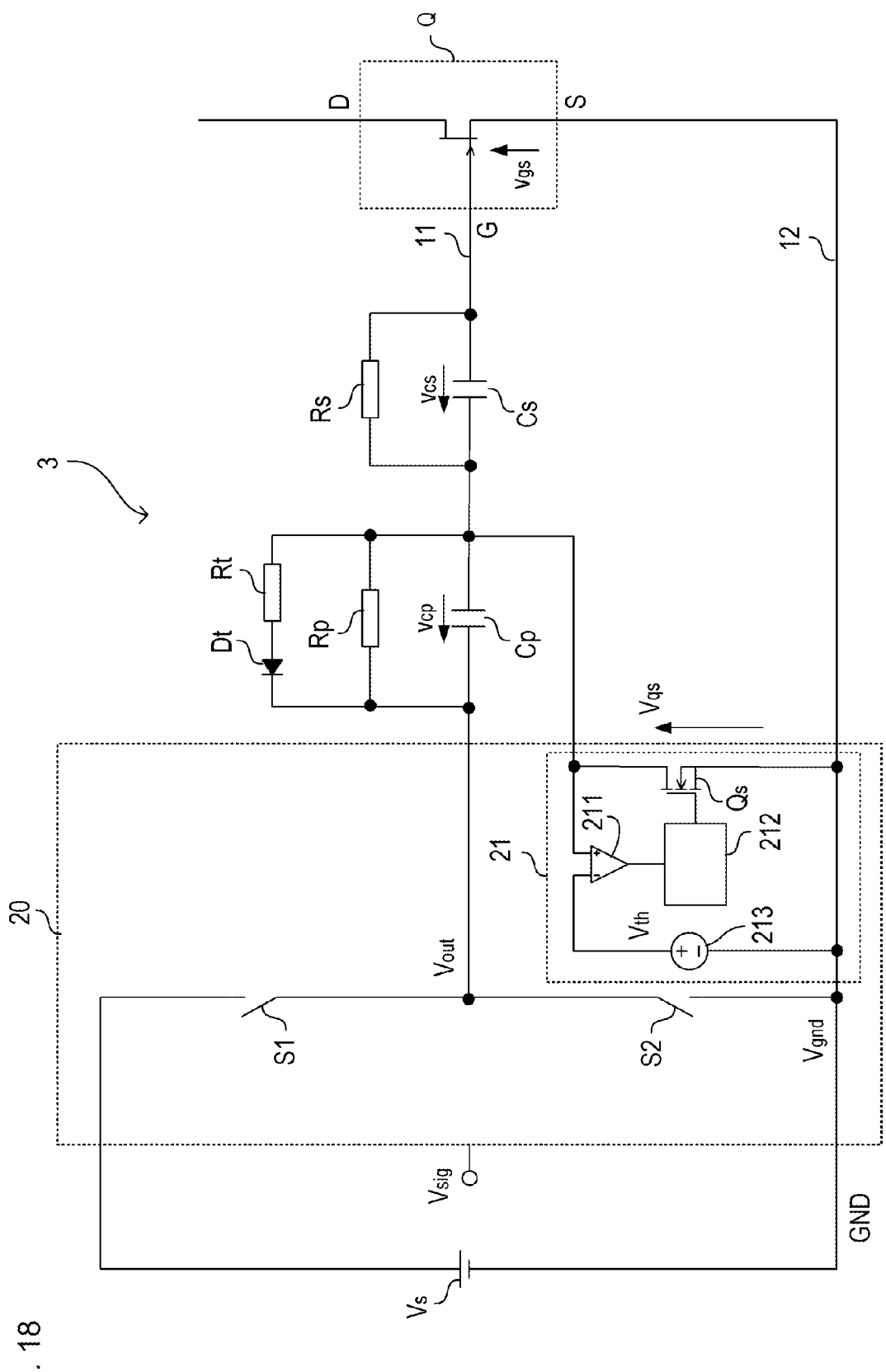
FIG. 18 is a circuit diagram showing a configuration of a gate driving circuit according to a third embodiment of the present invention.
Figure 19:
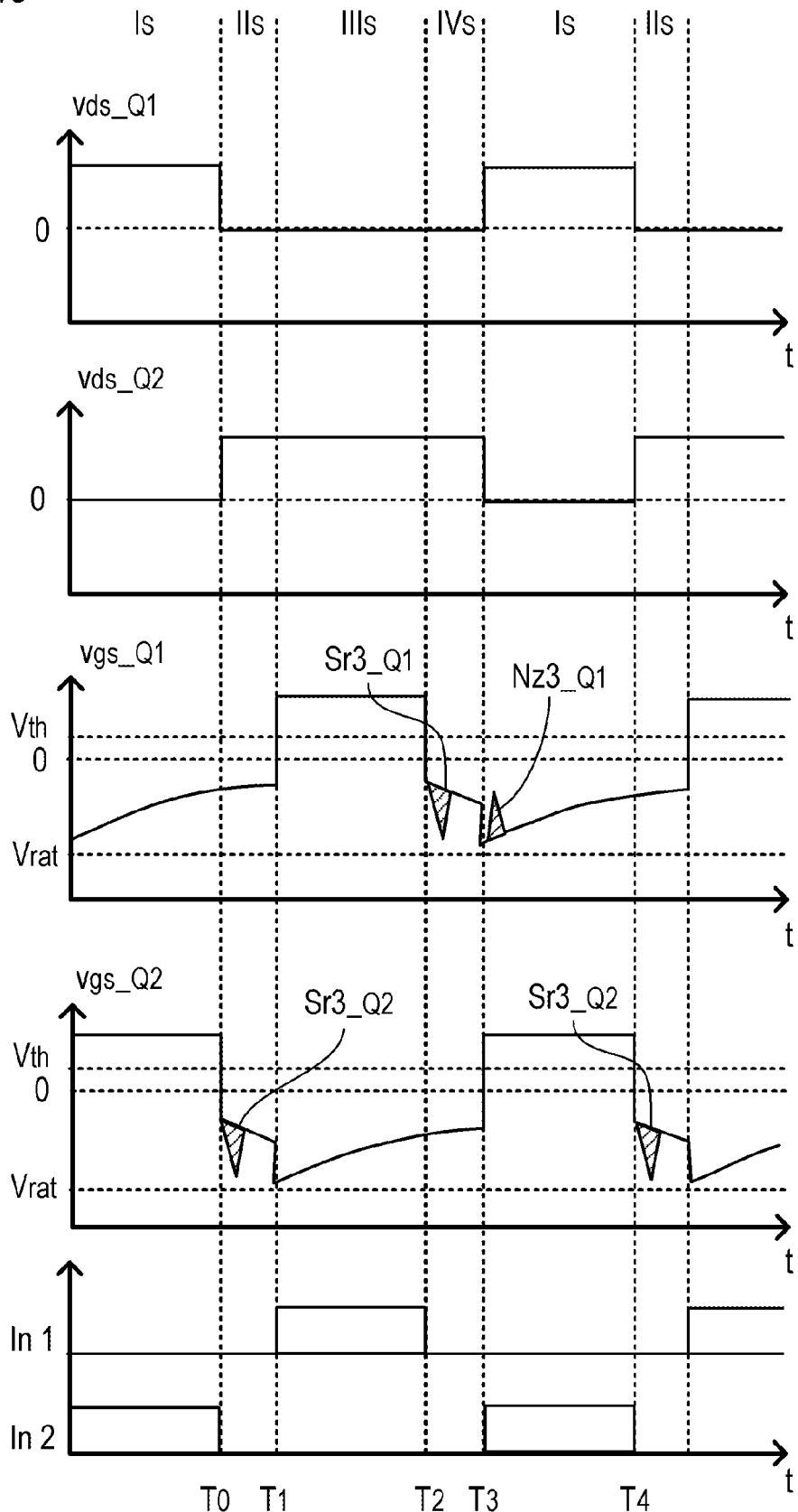
FIG. 19 is an operation sequence diagram of the gate driving circuit according to the third embodiment of the present invention.

FIG. 18 shows the gate driving circuit 3 according to the present embodiment. The gate driving circuit 3 according to the present embodiment has a configuration in which a diode Dt and a resistor Rt are added to the gate driving circuit 2 according to the second embodiment. FIG. 19 shows an operation sequence of the synchronous rectification-type boost chopper circuit 100 including the gate driving circuit 3 according to the third embodiment as the gate driving circuit GD1 and the gate driving circuit GD2.

In the gate driving circuit 3, the diode Dt and the resistor Rt connected in series are connected in parallel with a capacitor Cp and a resistor Rp. The diode Dt is connected such that a direction from a gate terminal of a switching element Q toward an output terminal Vout is a forward direction. A cathode terminal of the diode Dt is connected to the output terminal Vout, and an anode terminal of the diode Dt is connected to the resistor Rt. The other end of resistor Rt having one end connected to the anode terminal of the diode Dt is connected to the capacitor Cs and the resistor Rs. Here, the diode Dt and the resistor Rt correspond to a first diode and a third resistor of the present invention, respectively.

The decrease in the gate voltage vgs of the switching element Q in the mode $IV_D$ can be adjusted by adding the diode Dt and the resistor Rt to the gate driving circuit 2 according to the second embodiment. As a result, since the gate voltage during the mode $IV_D$ period can be held at a high value, the reverse conduction loss of the switching element Q1 in the mode $IV_s$ can be reduced (the same applies to the switching element Q2 in the mode $II_s$). In addition, since the gate driving circuit 3 includes a mirror clamp circuit 21 similarly to the second embodiment, the gate voltage when switching noise occurs due to switching of the switching element of the opposing arm can be lowered. As a result, for example, in the mode $I_s$, it is possible to prevent malfunction of the switching element Q1 due to the switching noise Nz2_Q1 when the switching element Q2 is turned on.

(Simulation)

Figure 20:
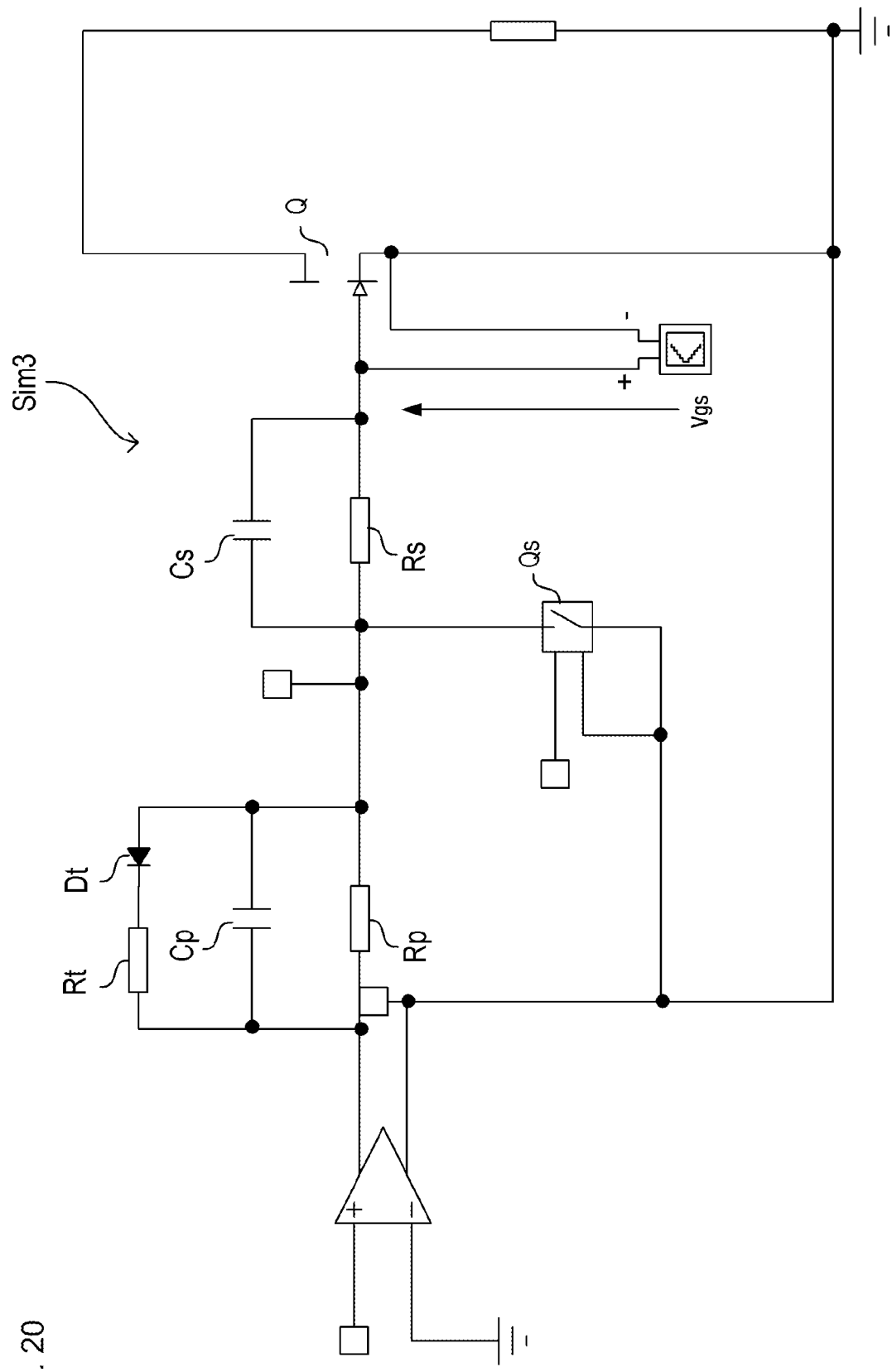
FIG. 20 is a diagram showing a circuit model corresponding to the gate driving circuit according to the third embodiment of the present invention.

Next, a gate driving circuit Sim3 shown in FIG. 20 was created as a model corresponding to the gate driving circuit 3 according to the third embodiment, and the effect of negative bias was confirmed using circuit simulator software.

In the circuit simulator software, simulation was performed with the gate voltage set to 12 V, the driving frequency set to 100 kHz, the duty ratio set to 50%, the resistance value of the resistor Rp set to 130Ω, the resistance value of the resistor Rs set to 200Ω, the capacitance of the capacitor Cp set to 600 pF, the capacitance of the capacitor Cs set to 22 nF, and the resistance value of the resistor Rt set to 300Ω.

Figure 21:
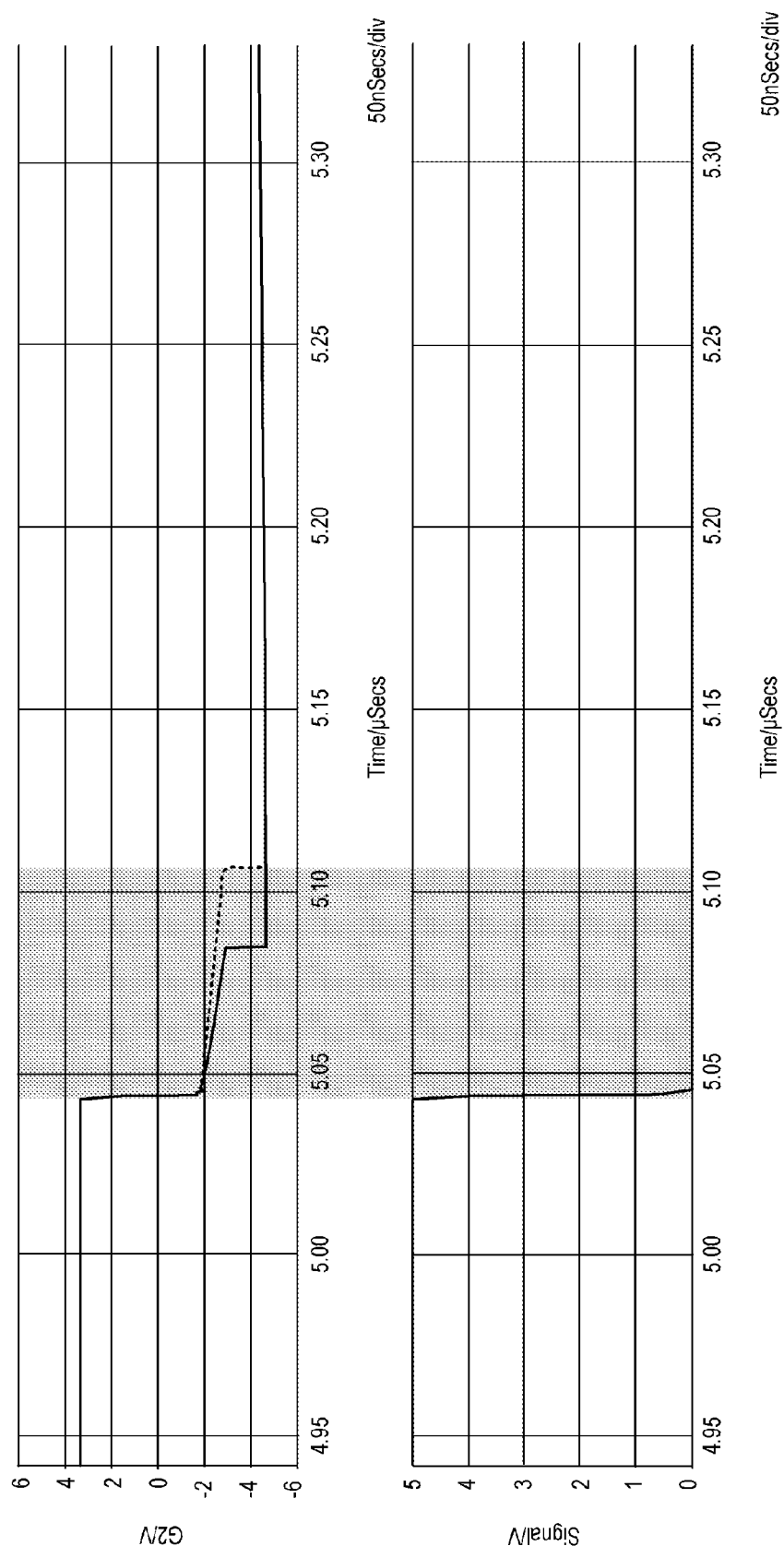
FIG. 21 is a graph showing a simulation result of the gate driving circuit according to the third embodiment of the present invention.
Figure 22:
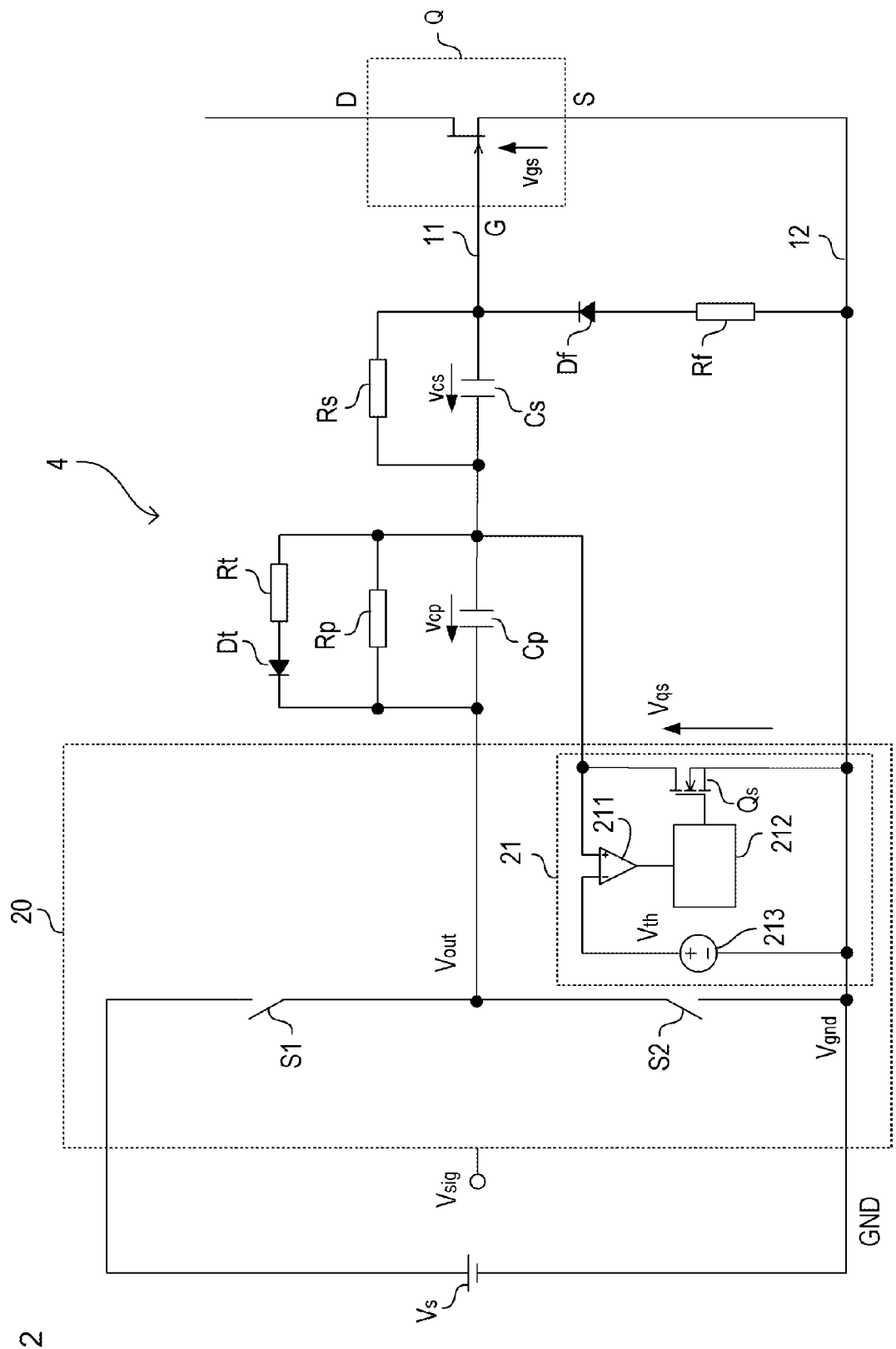
FIG. 22 is a circuit diagram showing a configuration of a gate driving circuit according to a fourth embodiment of the present invention.

The upper part of FIG. 21 shows a change in the gate voltage vgs of the switching element Q, and the lower part of FIG. 22 shows a change in the input signal Vsig. In the upper part of FIG. 18, the broken line indicates the waveform of the gate voltage vgs of the gate driving circuit Sim2, which is a model corresponding to the second embodiment, and the solid line indicates the waveform of the gate voltage vgs of the gate driving circuit Sim3, which is a model corresponding to the third embodiment. In the gate driving circuit 3 according to the third embodiment, the time of the mode $IV_s$ can be adjusted by changing the resistance value of the resistor Rt as indicated by hatching in FIG. 21. As a result, for example, by adjusting the resistance value of the resistor Rt in accordance with the switching timing of the switching element of the opposing arm and lowering the gate-source voltage vgs, switching noise can be reduced and malfunction can be suppressed.

Fourth Embodiment

Next, a gate driving circuit 4 according to a fourth embodiment of the present invention will be described. Configurations common to the first, second, and third embodiments are denoted by the same reference numerals, and detailed descriptions thereof will be omitted. The gate driving circuit 2 according to the present embodiment can be applied as a gate driving circuit GD1 and a gate driving circuit GD2 that drive the gates of the switching element Q1 and the switching element Q2 of the switching circuit and the synchronous rectification-type boost chopper circuit 100 shown in FIGS. 1 and 2, respectively. In addition, the gate driving circuit 4 can also be applied to gate drive of a switching element constituting a full bridge circuit as shown in FIG. 9.

Figure 23:
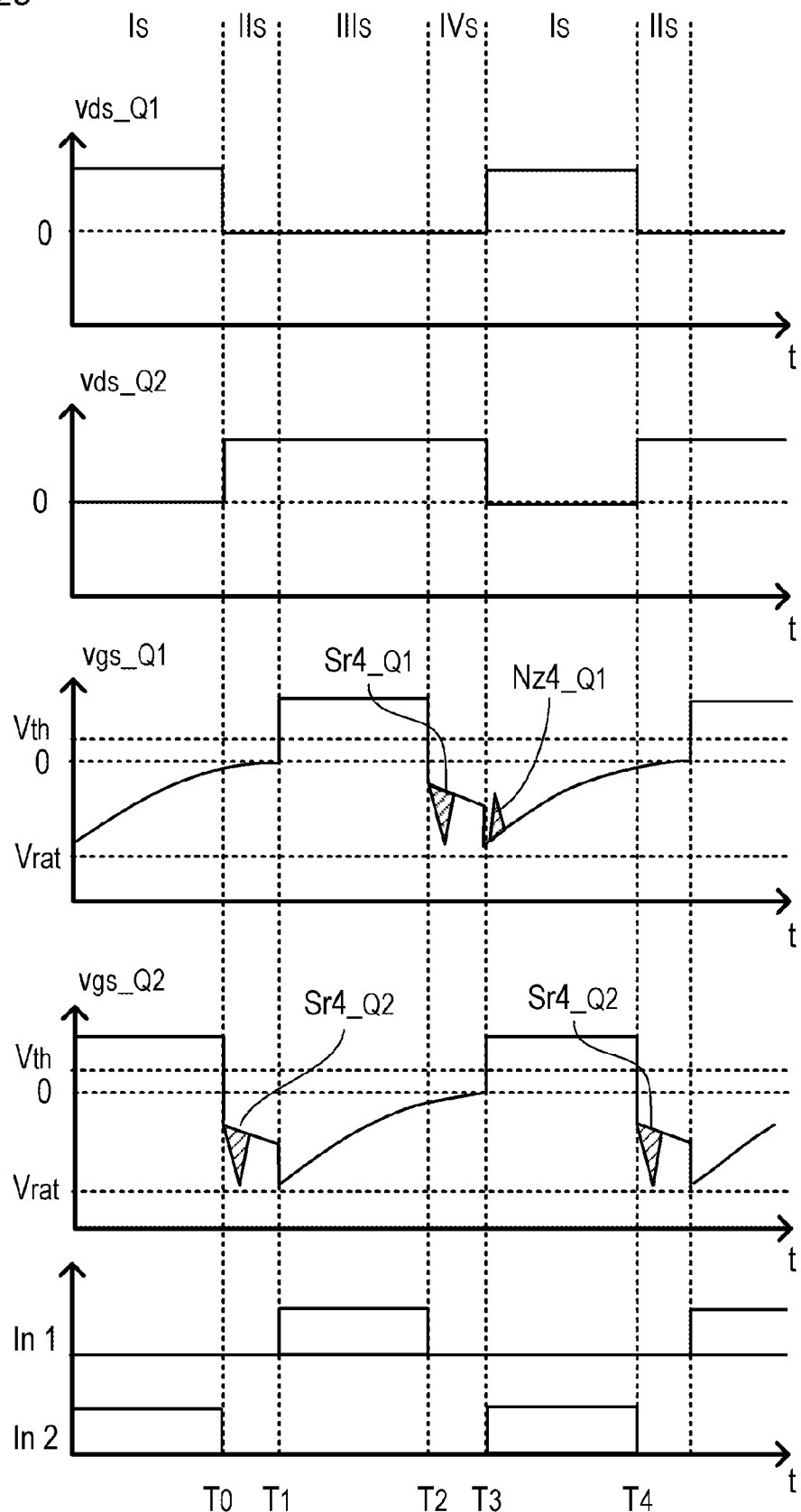
FIG. 23 is an operation sequence diagram of the gate driving circuit according to the fourth embodiment of the present invention.

FIG. 22 shows the gate driving circuit 4 according to the present embodiment. The gate driving circuit 4 according to the present embodiment has a configuration in which a diode Df and a resistor Rf are added to the gate driving circuit 3 according to the third embodiment. FIG. 23 shows an operation sequence of the synchronous rectification-type boost chopper circuit 100 including the gate driving circuit 4 according to the fourth embodiment as the gate driving circuit GD1 and the gate driving circuit GD2.

In the gate driving circuit 4, the diode Df and the resistor Rf connected in series are connected in parallel between a gate and a source of a switching element Q. The diode Df is connected such that a direction from a source terminal to a gate terminal of a switching element Q is a forward direction. A cathode terminal of the diode Df is connected between the gate element of the switching element Q and a capacitor Cs and a resistor Rs in a connecting wire 11 between the gate element of the switching element Q and an output terminal Vout. An anode terminal of the diode Df is connected to one end of the resistor Rf. The other end of the resistor Rf is connected to a connecting wire 12 between the source terminal of the switching element Q and a mirror clamp circuit 21. Here, the diode Df and the resistor Rf correspond to a second diode and a fourth resistor of the present invention, respectively.

The gate driving circuit 4 can adjust an increase in the gate voltage vgs_Q1 of the switching element Q1 in the mode $I_s$ and the mode $II_s$ (the same applies to an increase in the gate voltage vgs_Q2 of the switching element Q2 in the mode $III_s$ and the mode $IV_s$) by adding the diode Df and the resistor Rf to the gate driving circuit 3 according to the third embodiment. In addition, since the gate driving circuit 4 includes the mirror clamp circuit 21 similarly to the second embodiment, the gate voltage when switching noise occurs due to switching of the switching element of the opposing arm can be lowered. As a result, for example, in the mode IS, it is possible to prevent malfunction of the switching element Q1 due to the switching noise Nz4_Q1 when the switching element Q2 is turned on. Similarly to the third embodiment, the gate driving circuit 4 includes a diode Dt and a resistor Rt in parallel with the capacitor Cp and the resistor Rp, so that the decrease in the gate voltage vgs of the switching element Q in the mode $IV_s$ can be adjusted. As a result, since the gate voltage during the mode $IV_s$ period can be held at a high value, the reverse conduction loss of the switching element Q1 in the mode $IV_s$ can be reduced (the same applies to the switching element Q2 in the mode $II_s$).

(Simulation)

Figure 24:
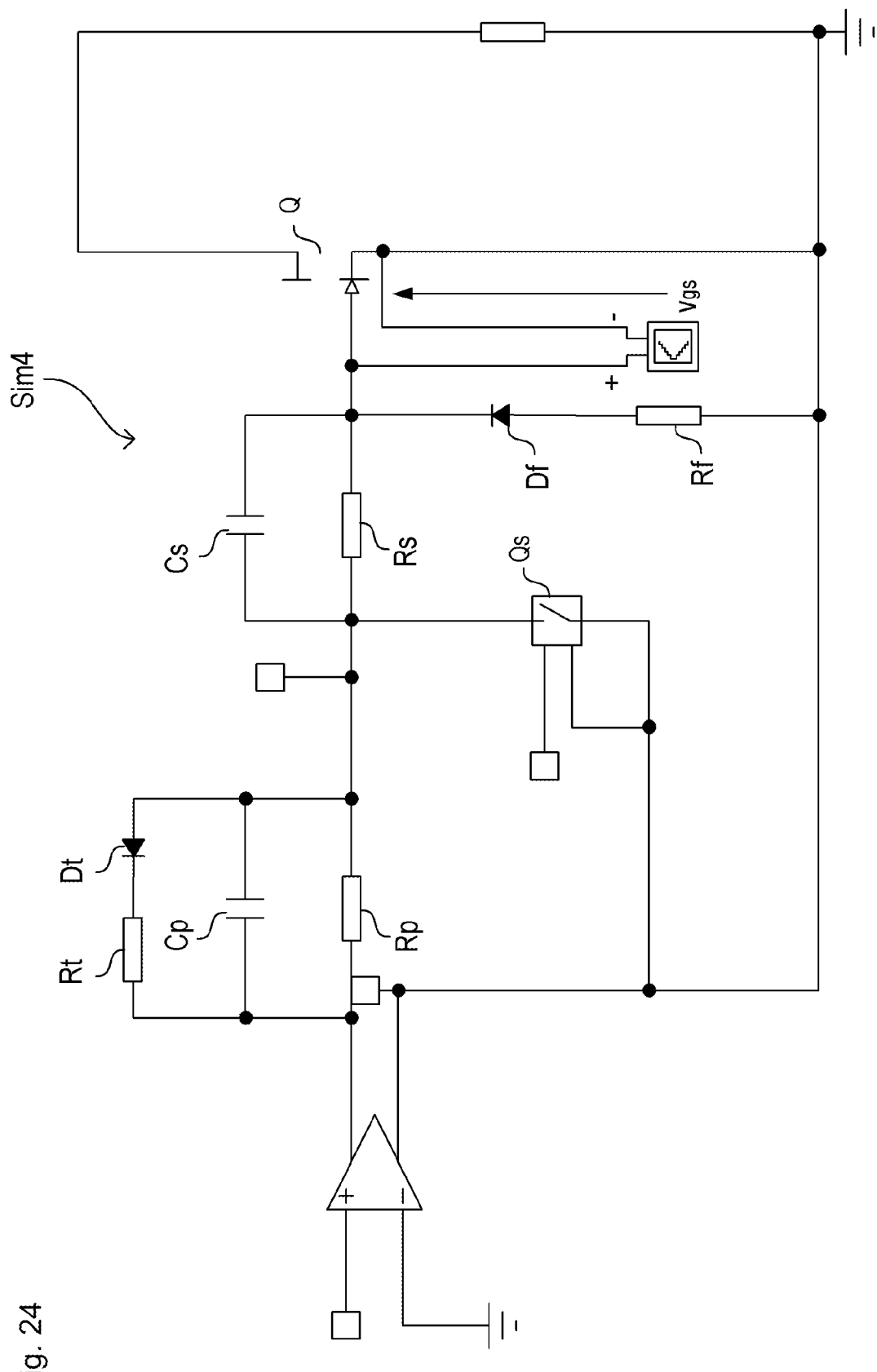
FIG. 24 is a diagram showing a circuit model corresponding to the gate driving circuit according to the fourth embodiment of the present invention.

Next, a gate driving circuit Sim4 shown in FIG. 24 was created as a model corresponding to the gate driving circuit 4 according to the fourth embodiment, and the effect of negative bias was confirmed using circuit simulator software.

In the circuit simulator software, simulation was performed with the gate voltage set to 12 V, the driving frequency set to 100 kHz, the duty ratio set to 50%, the resistance value of the resistor Rp set to 130Ω, the resistance value of the resistor Rs set to 200Ω, the capacitance of the capacitor Cp set to 600 pF, the capacitance of the capacitor Cs set to 22 nF, the resistance value of the resistor Rt set to 300Ω, and the resistance value of the resistor Rf set to 150Ω.

Figure 25:
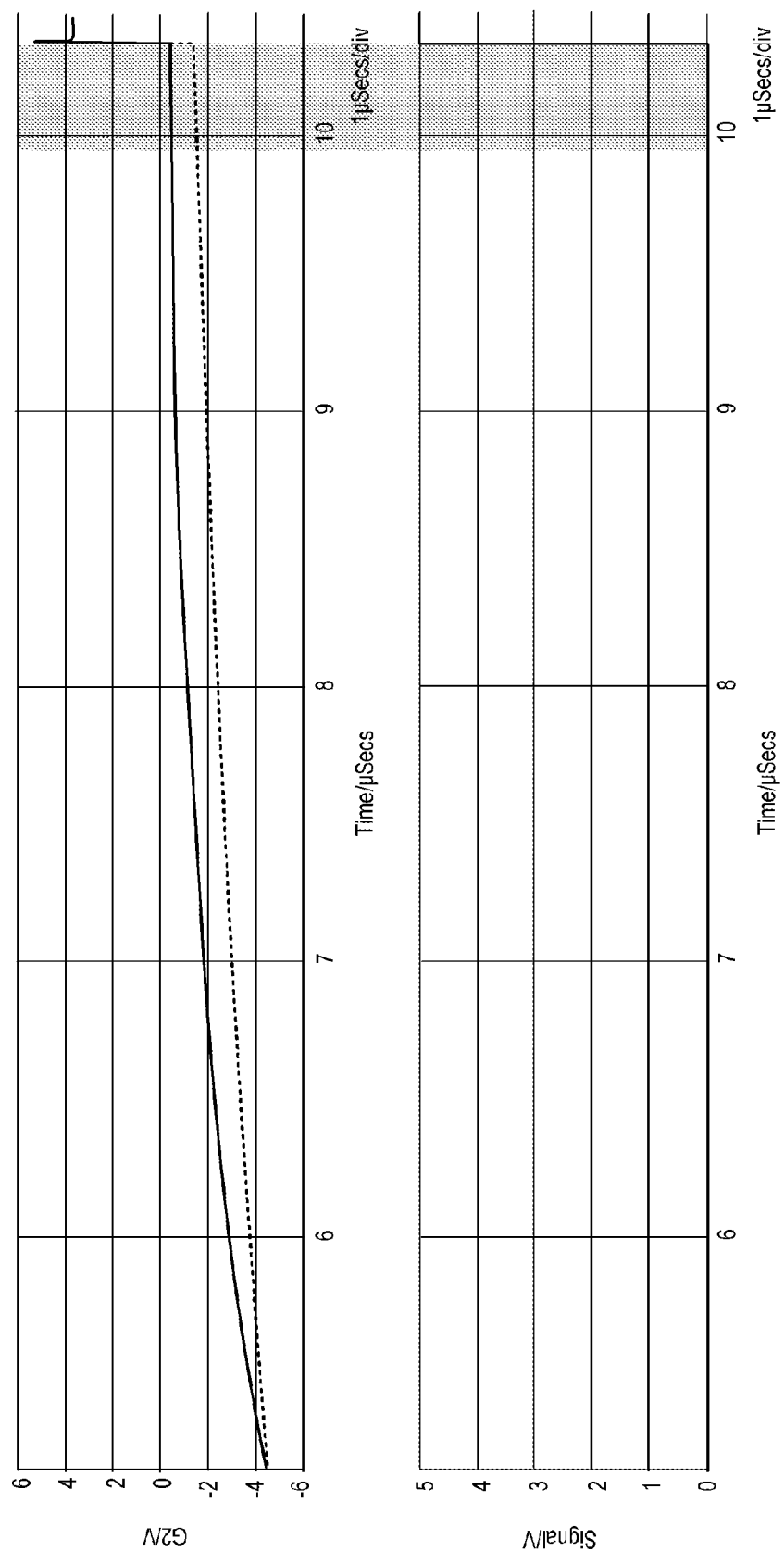
FIG. 25 is a graph showing a simulation result of the gate driving circuit according to the fourth embodiment of the present invention.

The upper part of FIG. 25 shows a change in the gate voltage vgs of the switching element Q, and the lower part of FIG. 25 shows a change in the input signal Vsig. In the upper part of FIG. 25, the broken line indicates the waveform of the gate voltage vgs of the gate driving circuit Sim3, which is a model corresponding to the third embodiment, and the solid line indicates the waveform of the gate voltage vgs of the gate driving circuit Sim4, which is a model corresponding to the fourth embodiment. When the switching element Q is turned off, the increase in the gate voltage vgs in the mode Is and the mode $II_s$ can be adjusted by changing the resistance value of the resistor Rf. As a result, for example, by adjusting the resistance value of the resistor Rf in accordance with the dead time indicated by hatching in FIG. 25, the gate-source voltage vgs can be increased, and the reverse conduction loss can be reduced.

Fifth Embodiment

Next, a gate driving circuit 5 according to a fifth embodiment of the present invention will be described. Configurations common to the first, second, third, and fourth embodiments are denoted by the same reference numerals, and detailed descriptions thereof will be omitted. The gate driving circuit 2 according to the present embodiment can be applied as a gate driving circuit GD1 and a gate driving circuit GD2 that drive the gates of the switching element Q1 and the switching element Q2 of the switching circuit and the synchronous rectification-type boost chopper circuit 100 shown in FIGS. 1 and 2, respectively. In addition, the gate driving circuit 5 can also be applied to gate drive of a switching element constituting a full bridge circuit as shown in FIG. 9.

Figure 26:
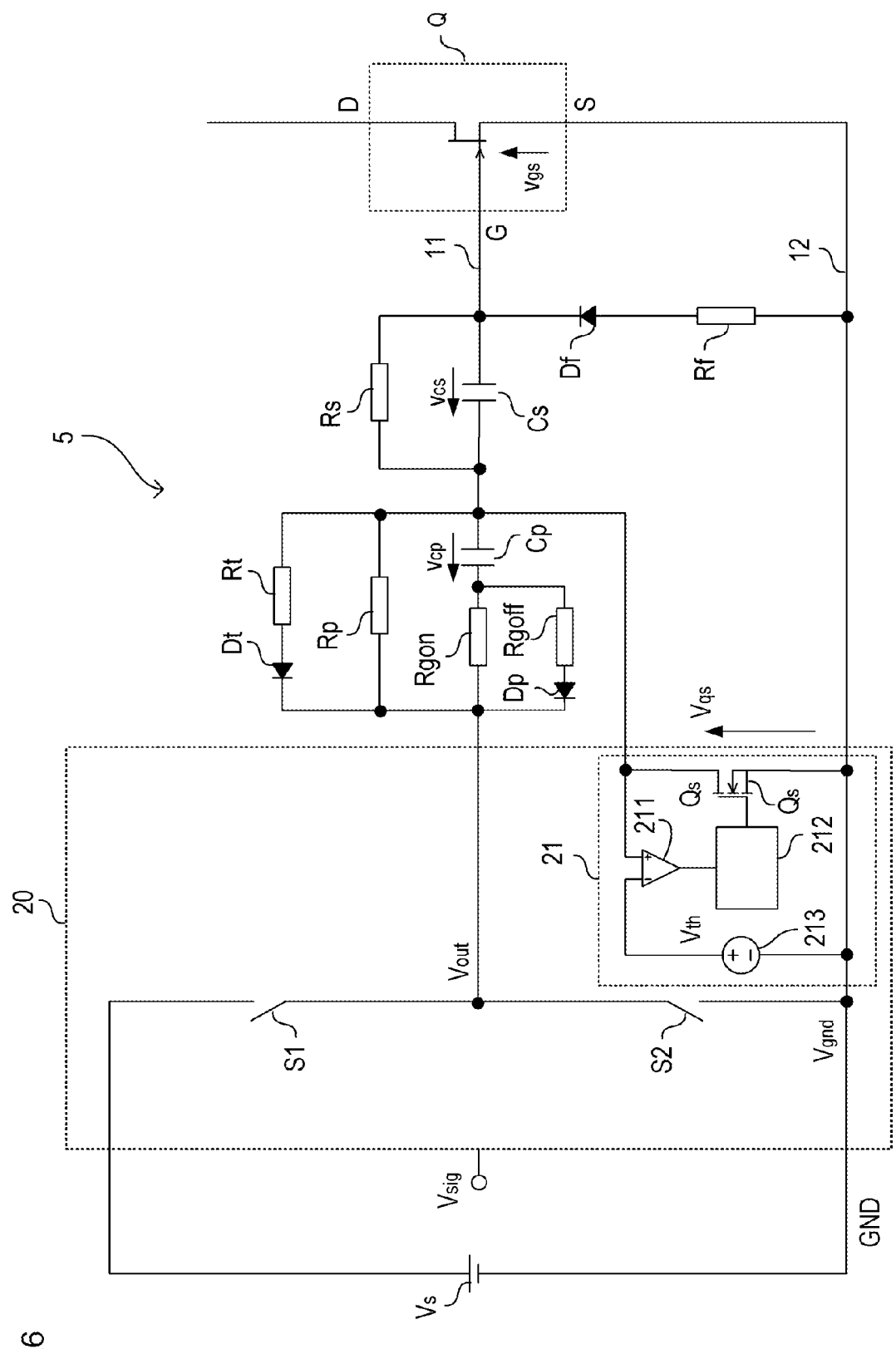
FIG. 26 is a circuit diagram showing a configuration of a gate driving circuit according to a fifth embodiment of the present invention.
Figure 27:
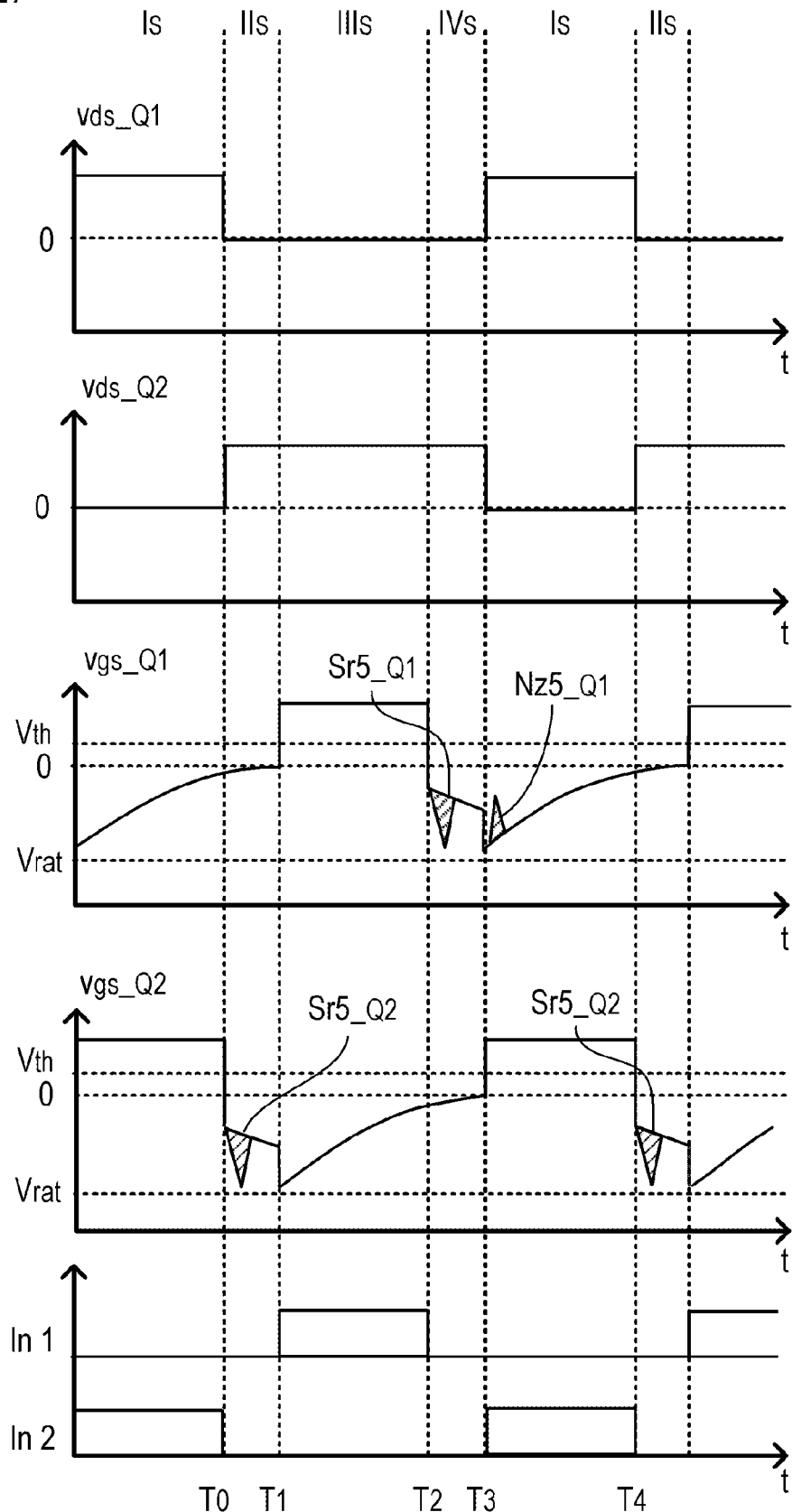
FIG. 27 is an operation sequence diagram of the gate driving circuit according to the fifth embodiment of the present invention.

FIG. 26 shows the gate driving circuit 5 according to the present embodiment. The gate driving circuit 5 according to the present embodiment has a configuration in which a resistor Rgon and a diode Dp and a resistor Rgoff connected in series are added to the gate driving circuit 4 according to the fourth embodiment. FIG. 27 shows an operation sequence of the synchronous rectification-type boost chopper circuit 100 including the gate driving circuit 5 according to the fifth embodiment as the gate driving circuit GD1 and the gate driving circuit GD2.

In the gate driving circuit 5, the resistor Rgon is connected to an output terminal Vout side of a capacitor Cp. As a result, the capacitor Cp and the resistor Rgon connected in series, a resistor Rp, and a diode Dt and a resistor Rt connected in series are connected in parallel. Furthermore, in the gate driving circuit 5, the diode Dp and the resistor Rgoff connected in series are connected in parallel to the resistor Rgon. The diode Dp is connected such that a direction from a gate terminal of a switching element Q toward the output terminal Vout is a forward direction. A cathode terminal of the diode Dp is connected to the output terminal Vout, and an anode terminal is connected to one end of the resistor Rgoff. The other end of the resistor Rgoff is connected to the output terminal Vout side of the capacitor Cp. Here, the resistor Rgon, the resistor Rgoff, and the diode Dp correspond to a fifth resistor, a sixth resistor, and a third diode, respectively.

The gate driving circuit 5 can adjust the switching speed of the switching element Q by adding the resistor Rgon, the diode Dp, and the resistor Rgoff to the configuration in which the capacitor Cp, the resistor Rp, and the diode Dt and the resistor Rt connected in series are connected in parallel in the gate driving circuit 3 according to the third embodiment. This can reduce switching noise and turn-off surge more than the gate driving circuit 3. In addition, since the gate driving circuit 5 includes the mirror clamp circuit 21 similarly to the second embodiment, the gate voltage when switching noise occurs due to switching of the switching element of the opposing arm can be lowered. As a result, for example, in the mode IS, it is possible to prevent malfunction of the switching element Q1 due to the switching noise Nz5_Q1 when the switching element Q2 is turned on. In addition, since the gate driving circuit 5 includes the diode Df and the resistor Rf as in the fourth embodiment, it is possible to adjust an increase in the gate voltage vgs_Q1 of the switching element Q1 in the mode $I_s$ and the mode $II_s$ (the same applies to an increase in the gate voltage vgs_Q2 of the switching element Q2 in the mode $III_s$ and the mode $IV_s$).

Sixth Embodiment

Next, a gate driving circuit 6 according to a sixth embodiment of the present invention will be described. Configurations common to the first, second, third, fourth, and fifth embodiments are denoted by the same reference numerals, and detailed descriptions thereof will be omitted. The gate driving circuit 6 according to the present embodiment can be applied as a gate driving circuit GD1 and a gate driving circuit GD2 that drive the gates of the switching element Q1 and the switching element Q2 of the switching circuit and the synchronous rectification-type boost chopper circuit 100 shown in FIGS. 1 and 2, respectively. In addition, the gate driving circuit 6 can also be applied to gate drive of a switching element constituting a full bridge circuit as shown in FIG. 9.

Figure 28:
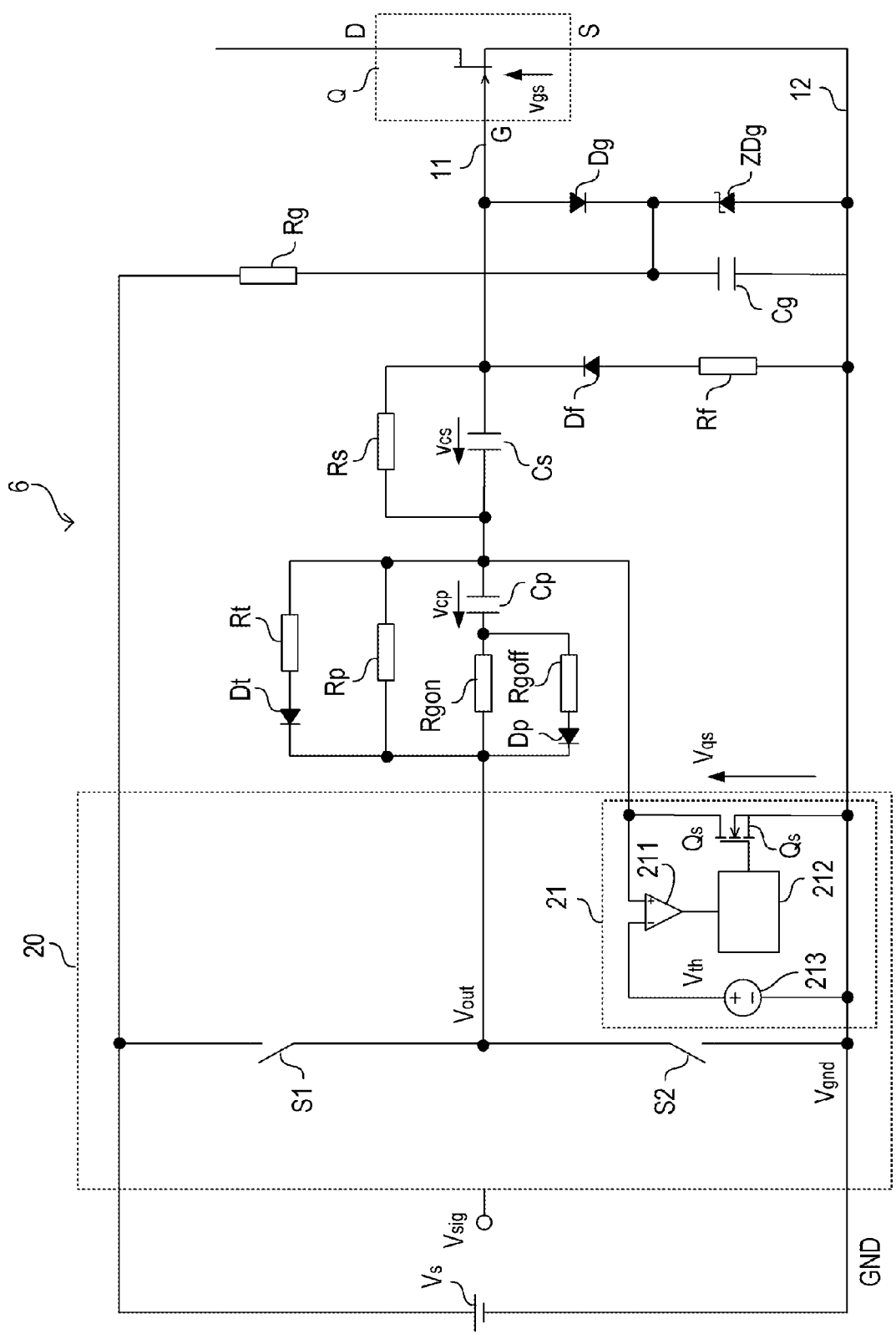
FIG. 28 is a circuit diagram showing a configuration of a gate driving circuit according to a sixth embodiment of the present invention.

FIG. 28 shows the gate driving circuit 6 according to the present embodiment. The gate driving circuit 6 according to the present embodiment has a configuration in which a resistor Rg and a capacitor Cg connected in series and a diode Dg and a Zener diode ZDg connected in series are added to the gate driving circuit 5 according to the fifth embodiment.

In the gate driving circuit 6, the diode Dg and the Zener diode ZDg connected in series are connected between a connecting wire 11 and a connecting wire 12 between a gate terminal and a source terminal of a switching element Q and a diode Df and a resistor Rf. An anode terminal of the diode Dg is connected to the connecting wire 11, a cathode terminal of the diode Dg is connected to a cathode terminal of the Zener diode ZDg, and an anode terminal of the Zener diode ZDg is connected to the connecting wire 12. Then, the capacitor Cg is connected to the Zener diode ZDg. That is, one end of the capacitor Cg is connected to the midpoint between the cathode terminal of the diode Dg and the cathode terminal of the Zener diode ZDg, and the other end of the capacitor Cg is connected to the connecting wire 12. Further, one end of the capacitor Cg is connected to one end of the resistor Rg. The other end of the resistor Rg is connected to a plus side of a gate power source Vs via an end of a gate driver 20 on a side opposite to an output terminal Vout side of a switch S1.

In the gate driving circuit 6, a constant voltage is generated from the gate power supply Vs by the resistor Rg, the capacitor Cg, and the Zener diode ZDg connected as described above. The constant voltage value at this time is designed according to the Zener voltage of the Zener diode ZDg. Therefore, when the gate voltage vgs larger than the constant voltage value is applied, the gate current flows from the connecting wire 11 to the diode Dg. At this time, since the voltage of the Zener diode ZDg through which the Zener current flows is held at the Zener voltage, the gate voltage vgs is held at a constant voltage value or less, and the voltage can be clamped. With such a configuration, in the gate driving circuit 6, an excessive gate surge can be suppressed. In addition, as shown in FIG. 28, in a case where a current-driven JFET is used as the switching element Q, the gate voltage is applied according to the gate current, and thus, it is possible to suppress the short-circuit current at the time of short-circuit by suppressing the gate voltage, that is, the gate current. Here, the resistor Rg, the capacitor Cg, the Zener diode ZDg, and the diode Dg correspond to a clamp circuit of the present invention, and the constant voltage value designed according to the Zener voltage of the Zener diode corresponds to a predetermined voltage value of the present invention.

Here, a constant voltage circuit is generated by the resistor Rg, the capacitor Cg, and the Zener diode ZDg, but the configuration of the constant voltage circuit is not limited thereto, and may be configured by a regulator or the like.

Seven Embodiment

Next, a gate driving circuit 6 according to a seventh embodiment of the present invention will be described. Configurations common to the first, second, third, fourth, fifth, and sixth embodiments are denoted by the same reference numerals, and detailed descriptions thereof will be omitted. The gate driving circuit 7 according to the present embodiment can be applied as a gate driving circuit GD1 and a gate driving circuit GD2 that drive the gates of the switching element Q1 and the switching element Q2 of the switching circuit and the synchronous rectification-type boost chopper circuit 100 shown in FIGS. 1 and 2, respectively. In addition, the gate driving circuit 7 can also be applied to gate drive of a switching element constituting a full bridge circuit as shown in FIG. 9.

Figure 29:
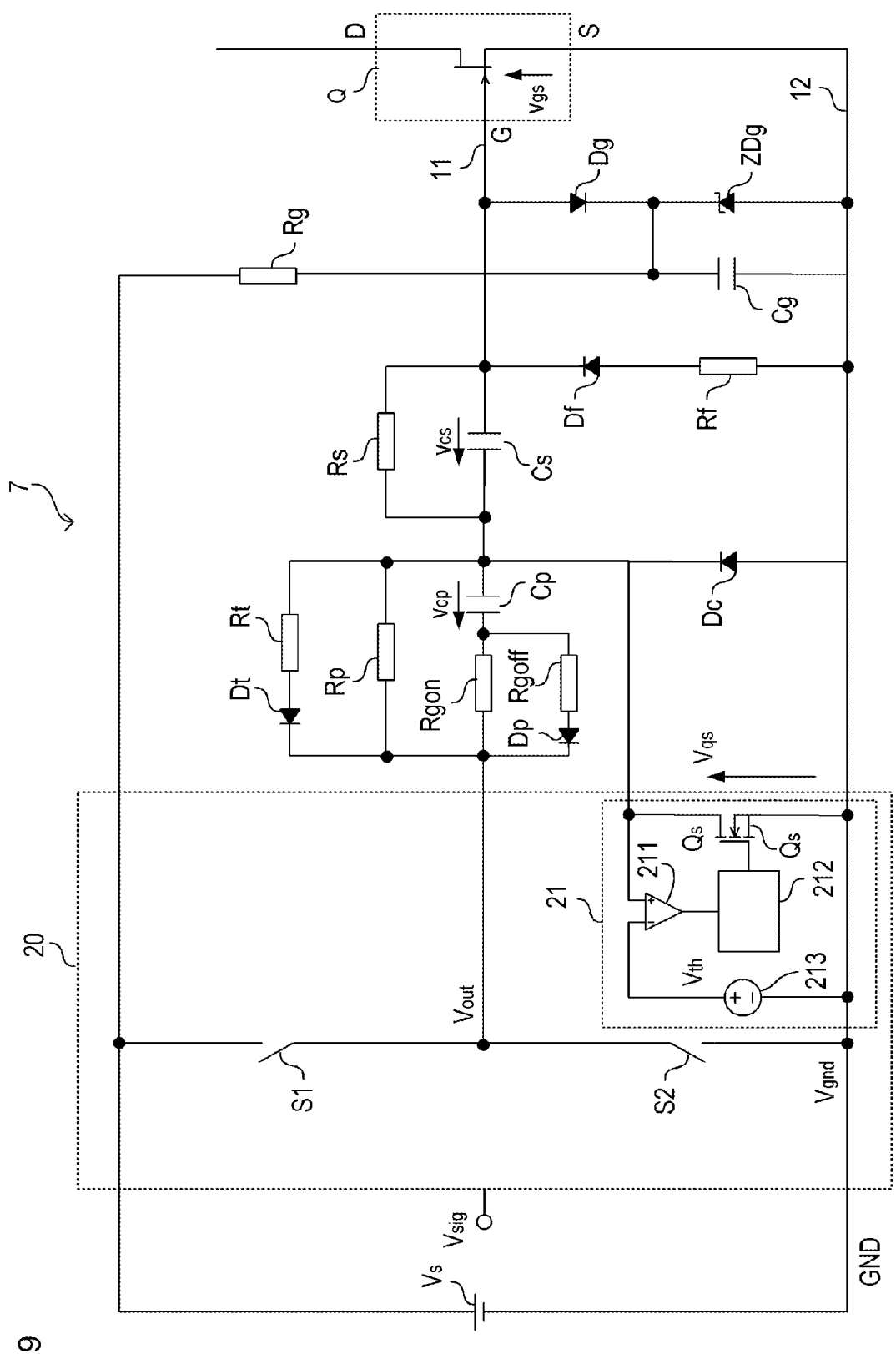
FIG. 29 is a diagram showing a configuration of a gate driving circuit according to a seventh embodiment of the present invention.

FIG. 29 shows the gate driving circuit 7 according to the present embodiment. The gate driving circuit 7 according to the present embodiment has a configuration in which a diode Dc is added to the gate driving circuit 6 according to the sixth embodiment.

In the gate driving circuit 7, the diode Dc is connected between the midpoint between a capacitor Cs and a capacitor Cp in a connecting wire 11 and a connecting wire 12. A cathode terminal of the diode Dc is connected to the connecting wire 11 side, and an anode terminal is connected between a resistor Rf in the connecting wire 12 and a mirror clamp circuit 21. Here, the diode Dc corresponds to a fourth diode of the present invention.

In the gate driving circuit 7, as described above, the diode Dc is connected such that a direction in which a current flows from the connecting wire 12 connected to the source terminal of the switching element Q toward the connecting wire 11 connected to the gate terminal is a forward direction. Therefore, when switching noise occurs in the gate voltage vgs during the turn-off period of the switching element Q, the impedance can be reduced by the diode Dc, and the noise can be bypassed. As a result, switching noise generated in the switching element Q can be reduced.

<Supplementary Note 1>

A driving circuit (1, 2, 3, 4, 5) that drives a switching element (Q), the driving circuit including: a controller (10) that includes a first terminal (Vout) connected to a gate terminal of the switching element (Q) and a second terminal (Vgnd) connected to a source terminal of the switching element (Q), and outputs a control signal from the first terminal (Vout) to the gate terminal; a first capacitor (Cs) and a first resistor (Rs) connected in parallel; and a second capacitor (Cp) and a second resistor (Rp) connected in parallel, in which the first capacitor (Cs) and the first resistor (Rs) are connected in series to a first connecting wire (11) for connecting the gate terminal and the first terminal (Vout) on the gate terminal side of the first connecting wire (11), and in which the second capacitor (Cp) and the second resistor (Rp) are connected in series to the first connecting wire (11) on the first terminal (Vout) side of the first connecting wire (11).

DESCRIPTION OF SYMBOLS 1, 2, 3, 4, 5 gate driving circuit
gate driver
11, 12 connecting wire
100, 200 switching circuit
Q switching element
Cs, Cp capacitor
Rs, Rp resistor

The invention claimed is:

1. A driving circuit that drives a switching element, the driving circuit comprising:
   a controller that includes a first terminal connected to a gate terminal of the switching element via a first connecting wire and a second terminal connected to a source terminal of the switching element via a second connecting wire, and outputs a control signal from the first terminal to the gate terminal;
   a first capacitor and a first resistor connected in parallel; and
   a second capacitor and a second resistor connected in parallel,
   wherein the first capacitor and the first resistor are connected in series to the first connecting wire on the gate terminal side of the first connecting wire,
   wherein the second capacitor and the second resistor are connected in series to the first connecting wire on the first terminal side of the first connecting wire,
   wherein a first diode and a third resistor connected in series are connected in parallel to the second capacitor and the second resistor, and
   wherein a cathode terminal of the first diode is connected to the first terminal.

2. The driving circuit for a switching element according to claim 1, wherein a mirror clamp circuit is provided between a midpoint between the first capacitor and the first resistor and the second capacitor and the second resistor in the first connecting wire and the second connecting wire.

3. The driving circuit for a switching element according to claim 1,
   wherein a second diode and a fourth resistor connected in series are connected between the first capacitor and the first resistor and the gate terminal in the first connecting wire and the second connecting wire; and
   wherein a cathode terminal of the second diode is connected to the first connecting wire.

4. The driving circuit for a switching element according to claim 1,
   wherein a fifth resistor is connected in series to the first terminal side of the second capacitor,
   wherein the second capacitor and the fifth resistor are connected in parallel to the second resistor,
   wherein a third diode and a sixth resistor connected in series are connected in parallel to the fifth resistor, and
   wherein a cathode terminal of the third diode is connected to the first terminal.

5. The driving circuit for a switching element according to claim 1, further comprising a clamp circuit that holds a voltage of the gate terminal with respect to the source terminal of the switching element at a predetermined voltage value or less.

6. The driving circuit for a switching element according to claim 1,
   wherein a fourth diode is connected between a midpoint of the first capacitor and the first resistor and the second capacitor and the second resistor in the first connecting wire and the second connecting wire, and
   wherein a cathode terminal of the fourth diode is connected to the first connecting wire.

7. A switching circuit comprising the switching element driven by the driving circuit for the switching element according to claim 1.

8. The switching circuit according to claim 7, further comprising a half bridge circuit configured by the switching element.

9. The switching circuit according to claim 7, further comprising a full bridge circuit configured by the switching element.

10. A driving circuit that drives a switching element, the driving circuit comprising:
- a controller that includes a first terminal connected to a gate terminal of the switching element via a first connecting wire and a second terminal connected to a source terminal of the switching element via a second connecting wire, and outputs a control signal from the first terminal to the gate terminal;
- a first capacitor and a first resistor connected in parallel; and
- a second capacitor and a second resistor connected in parallel,
- wherein the first capacitor and the first resistor are connected in series to the first connecting wire on the gate terminal side of the first connecting wire,
- wherein the second capacitor and the second resistor are connected in series to the first connecting wire on the first terminal side of the first connecting wire,
- wherein a second diode and a fourth resistor connected in series are connected between the first capacitor and the first resistor and the gate terminal in the first connecting wire and the second connecting wire, and
- wherein a cathode terminal of the second diode is connected to the first connecting wire.

11. A driving circuit that drives a switching element, the driving circuit comprising:
- a controller that includes a first terminal connected to a gate terminal of the switching element via a first connecting wire and a second terminal connected to a source terminal of the switching element via a second connecting wire, and outputs a control signal from the first terminal to the gate terminal;
- a first capacitor and a first resistor connected in parallel; and
- a second capacitor and a second resistor connected in parallel,
- wherein the first capacitor and the first resistor are connected in series to the first connecting wire on the gate terminal side of the first connecting wire,
- wherein the second capacitor and the second resistor are connected in series to the first connecting wire on the first terminal side of the first connecting wire,
- wherein a fifth resistor is connected in series to the first terminal side of the second capacitor,
- wherein the second capacitor and the fifth resistor are connected in parallel to the second resistor,
- wherein a third diode and a sixth resistor connected in series are connected in parallel to the fifth resistor, and
- wherein a cathode terminal of the third diode is connected to the first terminal.

\* \* \* \* \*